US007977801B2

(12) United States Patent
Takatsuki

(10) Patent No.: US 7,977,801 B2
(45) Date of Patent: Jul. 12, 2011

(54) INTEGRATED CIRCUIT CHIP COMPONENT, MULTI-CHIP MODULE, THEIR INTEGRATION STRUCTURE, AND THEIR FABRICATION METHOD

(75) Inventor: Ryo Takatsuki, Usa (JP)

(73) Assignee: Ryo Takatsuki, Oita-Ken (JP)

( * ) Notice: Subject to any disclaimer, the term of this patent is extended or adjusted under 35 U.S.C. 154(b) by 299 days.

(21) Appl. No.: 11/995,356

(22) PCT Filed: Jul. 14, 2006

(86) PCT No.: PCT/JP2006/314081
§ 371 (c)(1),
(2), (4) Date: Jan. 11, 2008

(87) PCT Pub. No.: WO2007/010863
PCT Pub. Date: Jan. 25, 2007

(65) Prior Publication Data
US 2009/0127716 A1    May 21, 2009

(30) Foreign Application Priority Data

Jul. 15, 2005  (JP) ................................. 2005-206318
Aug. 5, 2005  (JP) ................................. 2005-227396
Mar. 29, 2006  (JP) ................................. 2006-092378

(51) Int. Cl.
*H01L 23/48* (2006.01)
(52) U.S. Cl. ................................. 257/777; 257/E23.079
(58) Field of Classification Search .................. 257/685, 257/686, 777, 778, E23.001, 690, 750, 758, 257/48
See application file for complete search history.

(56) References Cited

U.S. PATENT DOCUMENTS 7,294,922 B2 * 11/2007 Jobetto et al. ................. 257/700
2003/0219969 A1   11/2003 Saito et al.
(Continued)

FOREIGN PATENT DOCUMENTS
JP    A H09-232503    9/1997
(Continued)

OTHER PUBLICATIONS

Serial No. PCT/JP2006/314081 filed Jul. 14, 2006, International Search Report and Written Opinion of the International Searching Authority, 4 pages (English translation); Japanese International Search Report and Written Opinion of the International Searching Authority, 4 pages.
(Continued)

*Primary Examiner* — N Drew Richards
*Assistant Examiner* — Hoa B Trinh
(74) *Attorney, Agent, or Firm* — Andrew F. Young, Esq.; Lackenbach Siegel, LLP

(57) ABSTRACT

A multi-chip module and an integrated structure of the present invention including: at least one of either a terminal unit formation area expanded type integrated circuit chip, or a terminal unit formation area identical type integrated circuit chip; terminal unit formation areas of these integrated circuits that are covered with protective layers, and expanded wiring units and terminal units formed in the protective layers; one or a plurality of the terminal unit formation area expanded type and the terminal unit formation area identical type integrated circuit chip components that are two-dimensionally or three-dimensionally aligned in further protective layers; a horizontal or a vertical wiring formed for arbitrarily connecting the plurality of the integrated circuit chip components in the further protective layers.

8 Claims, 11 Drawing Sheets

U.S. PATENT DOCUMENTS

2004/0195686 A1 10/2004 Jobetto et al.

FOREIGN PATENT DOCUMENTS

| | | |
|---|---|---|
| JP | A-09-321088 | 12/1997 |
| JP | 2871636 B | 6/1998 |
| JP | A-2001-196497 | 7/2001 |
| JP | 2002-246504 | 8/2002 |
| JP | A 2003-303938 | 10/2002 |
| JP | A 2002-343934 | 11/2002 |
| JP | 2004-71998 | 3/2004 |
| JP | 2004-79658 | 3/2004 |
| JP | 2004-71998 | 4/2004 |
| JP | 2004-79658 | 11/2004 |
| JP | 2005-019938 | 1/2005 |
| TW | 568351 | 12/2003 |
| TW | 584950 | 4/2004 |

OTHER PUBLICATIONS

Office Action issued Jul. 13, 2009 on Taiwanese Pat. Appln. No. 095125776 with English translation.

Office Action issued Aug. 5, 2009 on Taiwanese Pat. Appln. No. 2006-194792 with English translation.

Office Action issued Jul. 13, 2009 on Taiwanese Pat. Appln. No. 095125776 with English translation.

Office Action issued Aug. 11, 2009 on Japanese Pat. Appln. No. 2006-194792 with English translation.

Office Action issued Mar. 2, 2010 for Japanese Appln. Serial No. 2006-194792, with English translation (4 pgs.).

Drafted Office Action issued Sep. 13, 2010 for Japanese Appln. Serial No. 2006-194792, with English translation (6 pgs.).

* cited by examiner

INTEGRATED CIRCUIT CHIP COMPONENT, MULTI-CHIP MODULE, THEIR INTEGRATION STRUCTURE, AND THEIR FABRICATION METHOD

TECHNICAL FIELD

The present invention relates to a multilayer wiring, a planarization technology, and a three-dimensional conversion technology for chips in a silicon process technology, as well as system in-package (SIP), package on package (POP), or a three-dimensional conversion packaging technology such as multi-packages.

Priority is claimed on Japanese Patent Application No. 2005-206318, filed on Jul. 15, 2005, Japanese Patent Application No. 2005-227396, filed on Aug. 5, 2005, and Japanese Patent Application No. 2006-92378, filed on Mar. 29, 2006, the contents of which are incorporated herein by reference.

BACKGROUND ART

Integration of semiconductors has been conventional and is presently implemented by a silicon process and its role is clearly separated from packaging technology. For example, it is the silicon process that has mainly implemented integrating semiconductors, adding functions and creating values. Expenses of developing and fabricating an integrated circuit process, however, have kept on increasing; for example, the expenses of developing a 65 mm node have reached to 9 billion dollars all over the world, so that only few manufacturers can afford to cover them. As a result, a trend of monopolizing the few manufacturers is driving.

Moore's Law shows miniaturizing a silicon process which has resulted in reducing one silicon technology node (a 30% miniaturization e.g., the integration in which a cell size becomes half of the original size and chip integration becomes double) into 1.7 tenth in the past decade by updating the same process every two years while the packaging technology has resulted in reducing a wire radius from 100 µm to 30 µm pitches, flip-chip connection from 250 µm to 150 µm pitches, and a wiring board technology has resulted in reducing a 75 µm width to 25 µm, with more or less three tenth of the initial size, having a different reducing speed. A degree of reducing speed is estimated to further differentiate depending on these technologies as a future trend.

Although small integration technology is available and found in SIP and POP, it is extremely difficult even for the conventional packaging technology to implement high density integration with several times more than the present density to be an extension on its technology. Furthermore, chip integration in the final products is presently limited by packaging and mounting technologies. The present time likely desires large-scale integration other than a silicon process, and breakthrough of miniaturizing mounting wire connections capable of realizing higher informatization technology, implementation of portability, downsizing and lower costs.

Technologies available in the conventional SIP, POP and the three-dimensional chip module are featured in the following documents.

As a first example of the conventional technology, it is known that the structure includes a thin wiring film with chips connected and an adhesive film alternatively laminated and formed via-holes connected to both films (refer to FIG. 4 in Patent Document 1).

As a second example of the conventional technology, it discloses a structure wherein, semiconductor chips are loaded on the Paper Thin Package (PTP) substrate equipped with a via-connection electrode; the semiconductor chips are coupled to a core substrate equipped with a via-connection electrode superposed, and they are laminated by hot pressing (refer to FIG. 5 in Patent Document 2).

As a third example of the conventional technology, it discloses a structure wherein a plurality of the substrates equipped with conducting circuits and inter-layer conducting units are prepared; IC chips are loaded into the holes formed on the substrates, and these are superposed, pressed and laminated (refer to FIGS. 6, 9, and 12 in Patent Document 3).

As a fourth example of the conventional technology, it is known as a structure in which through-holes are drilled on a plurality of the chips and conducting resins are embedded in them, then connected for lamination (refer to FIG. 1 in Patent Document 1).

It is further known as a method for laminating plural chips by means of forming bumps above and below the through-holes of electrodes drilled on the chips, and coupling the bumps, or as a structure wherein one layer of plural Wafer Level Packages (WLPs) is embedded into the circuit board to increase a module mounting density.

| Patent Document 1 | Japanese Unexamined Patent Application, Publication No. H09-232503 |
| Patent Document 2 | Japanese Unexamined Patent Application, Publication No. 2002-343934 |
| Patent Document 3 | Japanese Unexamined Patent Application, Publication No. 2003-303938 |
| Patent Document 4 | Japanese Patent No. 2871636 |

The conventional technology has features, limitations and problems that can be summarized as follows:

(1) Problems in using bare chips

A probe test is implemented to bare chips on the wafer, and these bare chips are merely loaded onto a substrate as a laminate structure that is mainly used in the laminate structure of the conventional technology. Owing to demands on down-sizing and thin models, bare chips are prone to be thinner; as well as groups of the terminals formed in the bare chips that are also prone to have narrow pitches. Although electric characteristics tests for wafer level and burn-in test technology have remarkably developed in recent years, they are still imperfect in comparison with those adapted to unfinished products (package products). For example, a prober in a semiconductor inspection device has a difficulty in measuring high frequency of a few 100 MHz or higher under mass production because of the length, the minor diameter and the small pitch of its inspection needle are limited. It also has a sorting capability problem for non-defective products with electric characteristics of the bare chips; and an inspection limitation caused by costs; including a higher prober that also supports a multi-pin test of more than one thousand pins which are available in logic products. Furthermore, removing initial defects by a burn-in test is also limited.

In cases where large integration is implemented with unfinished products under such electric characteristics and reliability, a cost problem will largely occur in a yield of the integrated products and expenses of the final test will also incur. It is the biggest problem in the current SIP, and a multi-chip module of which integration density is limited.

Although high integration requires an integrated circuit chip with an ultrathin thickness (which is further reduced from a thickness of 100 µm or less to 10 µm or less), several problems occur such as distortion, deviation, splits and cracks to the bare chip itself caused by insufficient mechanical, intensity applied to the integrated circuit chip, uneven stress on both surfaces, and a quality deterioration of the chip occurs at the time of fabricating and handling with problems of weak humidity resistance and weak chemical resistance of an exposed bare die.

(2) Problems in using the packaged products as a component

In cases where packaged products are used as components, a problem of a bare chip test can be solved by means of implementing a final test to an element in a package and using the element for integration. However, another problem is left in the thickness (a few 10 μm or more) of an interposer (circuit board) itself, and the limitation of miniaturizing wire connections on an interposer of the chip, resulting in defects for down-sizing, thinner-modeling and higher integration (refer to (3) below). The bare chip itself has a limitation of ultrathin-modeling as described above, and the packaged products are further packaged, so dual costs incur as a problem. Although an example is known where a structure includes the packaged products embedded in the circuit board, it is difficult to make a wiring between the embedded packaged products because the packaged products can only be embedded in one layer of the substrate. The example has a problem of less competition in comparison with other existing technology (System in Package; SiP), considering its wiring costs.

(3) Limitation of wiring connection technology, wire bond, and bump

A wire bond can only have a wire radius of 15 μm or longer; due mainly to the limitation of a capillary; a joint pad also has a difficulty in implementing with 25 μm or less. Since wiring is basically connected between the upper and lower chips, and between the chip and the interposer, it is difficult to implement large integration (with 10 layers or more).

Forming a bump is costly, thus it is difficult to provide a 20 μm pitch, and a radius of 10 μm or less.

In cases of a stacked structure, a problem arises in limiting a large three-dimensional integration because 1) wiring is basically laminated between the upper and lower chips, and connected between the chip and the interposer, 2) it is therefore necessary for the wired bare chips to be processed, resulting in complicated wiring, 3) it is difficult to directly connect wiring even in the horizontal direction without an in-process circuit board.

(4) The limitation of technology that aligns bare chips in or above circuit boards and laminates the circuit boards with adhesion or thermal compression As previously mentioned, bare chip integration has basic problems. Therefore, it is not appropriate to apply stacking separate substrates with the bare chips mounted and bonding them with adhesion for small and thin-sized integrated modules; limiting its application field because micro patterns are limited owing to stacking accuracy, distortion and deviation of the substrates, and thermal compression occurs stress damage to particularly thin bare chips.

(5) Where chip lamination is implemented by means of drilling through-holes in the bare chips, embedding these holes with conducting resins and adhering upper and lower chips, it is possible to implement high integration with smaller shapes, but the high integration is limited because the bare chips have a basic problem, as well as problems of reducing yield caused by drilling the through-holes in the bare chips, quality deterioration, and higher costs, and further problems arise in positioning accuracy by adhesion, the adhesion reliability. Where bumps are formed above and under the through-hole electrodes and chip lamination is implemented by bump connection, reliability of multilayer bumps and fabricating costs become problems. Where lamination is basically implemented via through-holes in the chips, a problem arises in incurring costs for separately preparing additional circuits to the chips in order to secure selectivity because wiring is so limited that no chip selectivity can be secured. In the limited wiring function, integration improvement of the module is limited. As a result, fabricating exclusive chips drastically increases costs.

(6) The conventional technology has not provided consistent uniformed structure and fabricating methods including future miniaturization and integration possibilities because of various structures and fabricating methods from a viewpoint of meeting a short-term requirement of applications, including integrated circuit chips. Therefore, more amounts of time are consumed in setting technical goals, processes of development and mass production, development of material jigs and tools, standardization and improvement causing slower development speed and higher costs as a problem as well.

Under the above-mentioned background, it summarizes the current state that no method is provided using any interposers that implement ultra integration of the integrated circuit chips, assuring Known Good Die (KGD), which provides electric characteristics and reliability equal to the complete products, aligning in the third dimension a basic element structure capable of supporting ultrathin bare chips (with thickness from 200 μm or less to a few μm) and its basic elements with high density wiring, and capable of basically maintaining the same structure and the fabricating method to the future advance of the technical ultrathin-modeling and miniaturization.

DISCLOSURE OF INVENTION

The present invention realizes integration equal to the silicon process with a process and structure other than the silicon process with lower costs; also realizes a breakthrough that implements higher integration, multiplying the integration of the silicon process and accelerating value creation in the high density integration field of the integrated circuit chips.

In light of the conventional technology set forth therein, the present invention provides a completely new structure that is absent in the conventional technology structured according to new findings, and its fabrication method. It summarizes as follows:

1) The present invention provides a terminal unit formation area expanded type integrated circuit chip component including an integrated circuit chip equipped with a terminal unit, a protective layer made of an insulating material that has an area larger than a terminal unit formation surface of the integrated circuit chip and covering at least the terminal unit formation surface, and an expanded wiring unit, which connects to the terminal unit, and a realigned terminal unit formed in the protective layer, wherein the expanded wiring unit includes an interior vertical conducting unit extended and formed in a thickness direction of the protective layer from the terminal unit, a conducting unit that is extended and formed in the surface direction of the protective layer from the interior vertical conducting unit, an exterior vertical conducting unit that removes the conducting unit to the exterior of the protective layer, and a realigned terminal unit that is connected to the exterior vertical conducting unit and mounted to the exterior of the protective layer.

2) A multi-chip module of the present invention includes at least either one of a terminal, unit formation area expanded type integrated circuit chip component or a terminal unit formation area identical type integrated circuit chip component, wherein:

the terminal unit formation area expanded type integrated circuit chip component includes an integrated circuit chip equipped with a terminal unit, a protective layer made of an insulating material that has an area larger than a terminal unit formation surface of the integrated circuit chip and covering at least the terminal unit formation surface, and an expanded wiring unit, which connects to the terminal unit, and a realigned terminal unit formed in the protective layer, the expanded wiring unit including an interior vertical conducting unit extended and formed in a thickness direction of the protective layer from the terminal unit, a conducting unit that is extended and formed in the surface direction of the protective layer from, the interior vertical conducting unit, an exterior vertical conducting unit that removes the conducting unit to the exterior of the protective layer, and a realigned terminal unit that is connected to the exterior vertical conducting unit and mounted to the exterior of the protective layer; and the terminal unit formation area identical type integrated circuit chip component includes an integrated circuit chip equipped with a terminal unit, a protective layer made of an insulating material that has an area identical to a terminal unit formation surface of the integrated circuit chip and covering at least the terminal unit formation surface, and a wiring unit mounted at the protective layer, the wiring unit connecting the terminal unit of the integrated circuit chip to a terminal unit mounted at the exterior of the protective layer.

The multi-chip module of the present invention further includes a further protective layer in which one or a plurality of the terminal unit formation area expanded type and the terminal unit formation area identical type integrated circuit chip components are two-dimensionally or three-dimensionally aligned, and a horizontal wiring or vertical wiring formed in the further protective layers to arbitrarily connect the plurality of the integrated circuit chip components aligned two-dimensionally or three-dimensionally in the further protective layers.

3) The multi-chip module of the present invention may be configured to be flexibly connected via the horizontal wiring or vertical wiring from the exterior to any of the plurality of the integrated circuit chip components two-dimensionally or three-dimensionally aligned in the further protective layers.

4) In the multi-chip module of the present invention, a single-chip module or the multi-chip module may be formed on the circuit board, the single-chip module being configured with a single integrated circuit chip component aligned in the protective layer; wherein an electrode joint of the single chip module or the multi-chip module with the circuit board may be implemented with electroplating, and the protective layer of the single-chip module or the multi-chip module may be firmly adhered to the circuit board so that the single-chip module or the multi-chip module is unified with, the circuit board.

5) In the multi-chip module of the present invention, the integrated circuit chip components horizontally or vertically aligned may be covered in the further protective layer; wherein wiring for connecting each terminal of interior integrated circuit chip components may be mounted in the further protective layer, other terminals of which connections are extended may be aligned on the further protective layer, and the plurality of the integrated circuit chip components may be separately aligned in the further protective layer when each of the protective layer is unified.

6) In the multi-chip module of the present invention, the integrated circuit chip component may be provided together with an integrated circuit chip or a passive component with unifying a plurality of the protective layers thereof, the integrated circuit chip or the passive component being wired to an interior integrated circuit chip.

7) In the multi-chip module of the present invention, integrated circuit chip components may be unified with the terminal unit formation area expanded type integrated circuit chip via the terminal units of the integrated circuit chip by unifying their protective layers and the further protective layer with each other, the integrated circuit chip components meeting the requirement of having a 100 MHz or higher frequency function, passing an electric characteristics test including AC and parameter, and a burn-in test, or having the identical quality and reliability.

8) In the multi-chip module of the present invention, the vertical wiring or the horizontal wiring that selectively connects the interior integrated circuit chip components in the protective layers with any terminal of integrated circuit chip or passive components may be aligned at any of the exterior protective layers of the integrated circuit chip components, the integrated circuit chip, or the passive components in the multi-chip modules described in any one of 2) to 7) above.

9) The multi-chip module of the present invention may include test terminals for the integrated circuit chip in the multi-chip module at the lower layer, and with test terminals for the stacked circuit chip components in the multi-chip module at the upper layer may be electrically connected by vertical conducting units that conducts across the protective layer at the exterior side of the interior integrated circuit chip.

10) The multi-chip module of the present invention may further include wiring capable of selecting whether or not any of the connection terminals of arbitral integrated circuit chip components in the multi-chip module, integrated circuit chips, and passive components is connected via connection terminals other than those of the integrated circuit chip components, the integrated circuit chips and the passive components among exterior terminals of the multi-chip module, the arbitral integrated circuit chip components in the multi-chip module and the passive components in the multi-chip modules described in any one of 2) to 9) above.

11) A fabrication method for a multi-chip module of the present invention includes the steps of: fabricating a one-layer chip module by arranging the integrated circuit chip component, described in 1) or 2) above, on a substrate or a circuit board, forming a protective layer covering the integrated circuit chip component, and forming wirings connected to terminals of the integrated circuit chip component, via wirings connecting the terminals through the layer, and horizontal wirings connected to the via wirings and formed on the same layer in the protective layer; and repeating the step of fabricating the one-layer chip module so as to fabricate the multi-chip module in laminated structure.

12) A fabrication method for a multi-chip module of the present invention includes the steps of: mounting the integrated circuit chip component described in 1) or 2) above with the terminal unit upward on a lower protective layer made of an insulating material on a substrate; forming an upper protective layer made of a insulating material so as to cover the integrated circuit chip component on the lower protective layer; forming an interior vertical conducting unit in the upper protective layer, the interior vertical conducting unit being connected to the terminal unit of the integrated circuit chip component and exposed on the upper protective layer; forming an expanded wiring unit connected to the interior vertical conducting unit on the upper surface of the lower protective layer for a next integrated circuit chip component that are to be laminated; mounting the next integrated circuit chip component on the upper surface of the lower protective layer; forming an upper protective, layer on the lower protective layer to cover the expanded wiring unit; and forming an exterior vertical conducting unit in the upper protective layer, the exterior vertical conducting unit being connected to the expanded wiring unit and reaching to the upper surface of the upper protective layer; forming a terminal unit on the upper side of the exterior vertical conducting unit so that the terminal unit is positioned on the upper surface of the upper protective layer.

13) The fabrication method for the multi-chip module of the present invention includes the steps of mounting integrated circuit chip component described in 1) or 2) above on a lower protective layer made of an insulating material formed on a circuit board with a terminal unit of the integrated circuit chip component upward; forming via wiring coupled to a circuit board terminal and a terminal in the lower protective layer; forming an upper protective layer of an insulating material, so as to cover the integrated circuit chip component; forming a via wiring in the upper protective layer to be connected to a terminal formed on the lower protective layer; forming a terminal unit on the upper protective layer to be exposed to the upper protective layer; forming an interior vertical conducting unit on the terminal unit, the interior vertical conducting unit being connected to a terminal unit of the integrated circuit chip component; and forming an expanded wiring unit on the upper surface of the upper protective layer, the expanded wiring unit being connected to the interior vertical conducting unit.

14) The fabrication method for the multi-chip module of the present invention may include the steps of aligning a plurality of the integrated circuit chip components in a horizontal direction on the lower protective layer, and forming a horizontal wiring that connects each of the expanded wiring units of these plurality of the integrated circuit chip components in a horizontal direction.

15) The fabrication method for the multi-chip module of the present invention may include the step of unifying each of the protective layers of integrated circuit chip components with a further protective layer via terminal units of the terminal unit formation area expanded type or the terminal unit formation area identical type integrated circuit chip; the integrated circuit chip components meeting the requirement of having a 100 MHz or higher frequency function, passing an electric characteristics test including AC and parameter, and a burn-in test.

16) The fabrication method for the multi-chip module of the present invention includes the steps of: mounting the integrated circuit chip having a terminal unit with the terminal unit upward on a lower protective layer made of a insulating material on the substrate; forming an upper protective layer made of a instating material, on the lower protective layer so as to cover the integrated circuit chip; forming an interior vertical conducting unit in the upper protective layer, the interior vertical conducting unit being connected to the terminal unit of the integrated circuit chip and exposed on the upper protective layer; forming an expanded wiring unit on the upper surface of the upper protective layer so as to be connected to the interior vertical conducting unit; forming a further upper protective layer on the upper protective layer, the further upper protective layer covering the expanded wiring unit; forming an exterior vertical conducting unit in the further upper protective layer, the exterior vertical conducting unit being connected to the expanded wiring unit and reaching to an upper surface of the further upper protective layer; and forming a terminal unit on the upper side of the exterior vertical conducting unit so as to be positioned on the upper surface of the upper protective layer.

17) The fabrication method for the multi-chip module of the present invention may include the steps of laminating plural chip modules obtained by the fabrication methods described in any one of 11) to 16) above, and connecting a wiring unit of an upper chip module with a wiring unit of a lower chip module by an vertical conducting unit.

18) The fabrication method for the multi-chip module of the present invention may include the steps of obtaining plural chip modules according to the fabrication methods described in any one of 11) to 17) above, and laminating these chip modules; wherein wiring units of chip modules in the upper layer and the lower layer are connected by means of selectively connecting an arbitral connecting terminal of an arbitral chip module in the final chip module, an arbitral connecting terminal of an arbitral chip module in the chip module, or an exterior terminal of the chip module with an arbitral connecting terminal of other chip module in the chip module.

19) The fabrication method for the multi-chip module of the present invention may include the steps of: three-dimensionally aligning a plurality of integrated circuit chips in an insulating material together with a wiring that arbitrarily connects between the plurality of the integrated circuit chips; as a method of fabricating a unified multi-chip module in the insulating material, embedding integrated circuit chip components or various chip modules into an insulating material, or covering them with an insulating material; coupling, unifying and integrating them by curing the insulating material covering the integrated circuit chip components or the chip modules before forming wiring patterns on the insulating material.

20) In the fabrication method for the multi-chip module of the present invention, electric characteristics and reliability of all elements that configure the chip modules described in any of 11) to 19) are assured by the step of only testing wiring functions and characteristics in the chip modules as a method for assuring electric functions and characteristics of the chip modules.

According to the present invention, the following effects can be obtained:

1) Thin elements for integrating integrated circuit chips can be fabricated in extremely small sizes in comparison with conventional package products without interposers; by means of assuring the same as fine and ultrathin and KGD products; in other words enabling high frequency higher than a few thousand MHz and multi-pin tests, similar to packaged products, to expand an applicable range of an electric characteristic test and applying a burn-in test that removes initial reliability defects to judge non-defectiveness of the elements. Test terminal pitches of the elements can be selected most appropriate to 300 μm of the conventional packaged products, along with socket technology; for example, between 80 μm and 150 μm, together with the best radius layout. It is also possible to avoid mechanical pressure to the chips at the time of a test contact by means of further reducing terminal pitch at a level between 20 μm and 30 μm for restricting the current bonding and the pump bond, and aligning the terminals outside of the chip surface, along with the future advance of the technology.

2) Since the above elements use insulating materials to loosen stress applied to both surfaces of the integrated circuit chips and protect the integrated circuit chips, the elements can support thin-modeling of the integrated circuit chips from 100 μm or less to a few μm, resulting in extremely low damages caused in the process of fabricating integration. In other words, extremely thin elements can be fabricated without any damages.

3) Since the three-dimensional integration fabricating process stacks a protective layer of the embedded elements and an insulating material to be embedded together with a wiring that connects between the elements, every layer firmly adheres and unifies them; less stress is given to the elements by stacked and superposed lamination, so that high density and high integration is available. Even the integrated circuit chips that integrate them are thin; they are covered and protected with a protective layer, so that mechanical strength as well as chemical resistance and humidity resistance increase and quality deterioration can be prevented during the fabricating step.

4) Since patterning at the three-dimensional integration step is applied by lithography wiring is basically performed by thin coating; wiring miniaturization can easily be preceded by the development of the silicone process technology without a problem of superposing accuracy, wiring bonding and metal joints, such as solders. Since modules are in wiring connections on the circuit boards due to a thin coating, and the insulating layer is firmly adhered and unified, it is possible to provide micro fabrication with good accuracy without giving thermal stress to the ultrathin integrated circuit chip components. Furthermore, it provides advantages in cost and quality because the chips are unified into the circuit boards at the module fabricating process so that the mounting process can be skipped.

5) It is also possible to promote high density wiring capacity by wiring miniaturization, plural power source lines can be provided, ground lines can be freely prepared, accuracy of wiring patterns can be improved, and passive components such as capacitors and coils can easily be incorporated. Intra-module wiring capability is at the same level as the state in which an element is aligned in one layer on the circuit board (in flat). In other words, it is possible to connect intra-module elements from, inside and outside the module without via-connection of other elements, so that module capability further increases. Since the shape of a module is small and can support high frequency requirements, SI (signal integrity) demands at the time of high frequency from the module can be supported. As a result, higher performance and enhanced functionality can be promoted.

6) It is also possible to spread heat to some extent by formation of lines for radiating heat.

7) Various integrated circuit chips can be integrated, so that flexibility and general versatility of the module increases because the area of an insulating material that coats the integrated circuit chip, including the three-dimensional integrated process, and the area of the connecting terminals formed on the insulating material are both larger than the area of the chip and the connecting terminals on the chips; in other words, the elements of which terminals are spread and connected, the elements having the area of the insulating material that requires no tests such as high frequency tests and multi-pin tests are the same as the area of the connecting terminals on the insulating material; express differently, the elements of which terminals on the chip are expanded and connected in the same area can be incorporated in the same manner.

8) Since the multi-chip module structure can three-dimensionally arrange and align the integrated circuit chip in the insulating material together with wiring that surrounds and connects between the integrated circuit chips, high density integration in the same shape can be implemented in accordance with thinner chips, lithography and development of planarization technology, and not a large amount of time is consumed at development and mass production. Therefore, standardizing formation of the specification is easily available, contributing to designing, fabricating and applying the products.

9) Since the elements included in the multi-chip module are completely assured in their non-defectiveness, the elements to be incorporated have no yield problem and high integration is available. The electric characteristics test that assures the electric characteristics of the multi-module chips conventionally requires drastic man-hours every time when elements increase, including a test for the elements in the chips. This is one reason for causing high cost. According to the present invention, a cost for implementing a test can be drastically reduced because the electric characteristics assurance, at the time of multi-chip modules in mass production, can be mainly given to wiring functions and the quality inspection after the evaluation of the system.

10) Multi-chip modules with drastically higher density than conventional technology can be used; for example, a 1 mm sized layer including more than 16 to 32 laminations; if they are three-dimensionally integrated, the integrations more than their horizontal unit multiples can use tip integrated circuit chips as components. This means integration higher than a few node generations of the silicon technology, while its development and fabricating costs are extremely less than those of the silicon process.

11) Applied products, for example, large integration of general memory chips, such as DRAM, FLAH memories themselves have large applications. Memory chips, such as MRAM and FRAM, have high performance, but miniaturizing their cells is difficult; it can be effectively high integrated by means of separating the cells and the spherical circuit into different chips before implementing high density integration. It can be a very effective module when an integrated circuit chip, which is either technically or economically difficult to be integrated, is fabricated on the same silicon process. It greatly contributes to higher performance of mobile devices, such as cellular phones, larger capacity of flash memories, and development of mobile PCs, such as HDD alternation. Basically, difficulty in fabricating at the same silicon process, such as the mixture of analog ICs and digital ICs, meet the requirement of high costs or products that are difficult to be fabricated. In cases where large catch memories of high performance CPUs can be separated in the module, costs of fabricating the high performance CPUs are drastically reduced. Furthermore, integrated circuit chips on a majority of the current wiring boards and other passive components can be miniaturized and unified from the possibility of hierarchic large integration; it leads to higher performance, enhanced functionality and lower costs to all devices that require integrated circuit chips, including mobile products.

12) An integrated module can be formed on the circuit board acting as a multi-chip module, and connection terminals are formed on the outer most of the multi-chip module to become a higher integrated and more enhanced functional device technically or economically difficult to be integrated, is fabricated on the same silicon process. It greatly contributes to higher performance of mobile devices, such as cellular phones, larger capacity of flash memories, and development of mobile PCs, such as HDD alternation. Basically, difficulty in fabricating at the same silicon process, such as the mixture of analog ICs and digital ICs, meet the requirement of high costs or products that are difficult to be fabricated. In cases where large catch memories of high performance CPUs can be separated in the module, costs of fabricating the high performance CPUs are drastically reduced. Furthermore, integrated circuit chips on a majority of the current wiring boards and other passive components can be miniaturized and unified from the possibility of hierarchic large integration; it leads to higher performance, enhanced functionality and lower costs to all devices that require integrated circuit chips, including mobile products.

12) An integrated module can be formed on the circuit board acting as a multi-chip module, and connection terminals are formed on the outer most of the multi-chip module to become a higher integrated and more enhanced functional device. Further, higher integration is enabled with a plurality of the multi-chip modules further integrated. In other words, hierarchy of the multi-chip modules can be implemented unifying integrated circuit chips with different thicknesses and passive components into a module, so that the flexibility and general versatility are increased more.

13) Since the wiring function in the multi-chip module can be directly connected to any connection terminals of any chips from external wirings or any connection terminals of any chips in the modules without being connected to the connection terminals of other chips, the present invention has a flat wiring function with flexibility, even in the stacked structure.

Figure 1:
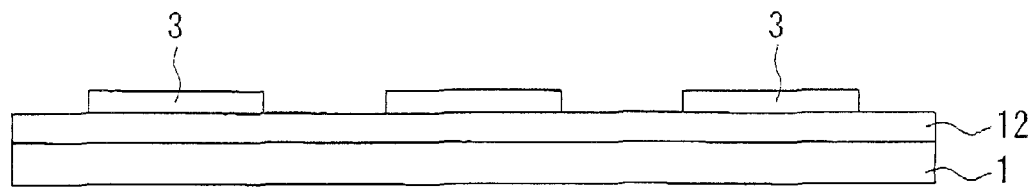
FIG. 1 is a cross-sectional view of the integrated circuit chip aligned on the protective layer at lower insulation on the platform.

In the drawings, the reference numerals denote the followings:

| | |
|---|---|
| A, A1, A2, A3, A4, An | Terminal unit formed area expanded type integrated circuit chip components |
| B, B1, B2, B3, B4, Bn | Terminal unit formed area identical type integrated circuit chip components |
| C, D, H, J | Single chip module or multi-chip module |
| E, F, G, K | Multi-layers module |
| 1. | Platform |

| | |
|---|---|
| 2 | Protective layer (protective layer united by the lower protective layer 7 and the upper protective layer 8) |
| 3. | Integrated circuit chip |
| 5. | Expanded wiring unit |
| 6. | Surface expanded terminal unit |
| 7. | Protective layer (protective layer united by the lower protective layer 12 and the upper protective layer 13 at the insulating material) |
| 7 a | Coating layer |
| 7 b | Lower via wiring unit (interior vertical conducting unit) |
| 8 | Upper protective layer (for rewiring) |
| 9 | Upper via wiring (exterior vertical conducting unit) |
| 20 | Protective layer |
| 10 | Terminal unit (surface expanded terminal unit) |
| 12 | Insulating material lower protective layer |
| 13 | Upper protective layer |
| 18 | Insulating material lower protective layer that aligns the integrated circuit chip components |
| 19 | Coating protective layer for rewiring the integrated circuit chip components |
| 20 | Further protective layer coating with the integrated circuit chip components (the protective layer united by 18 and 19) |
| 22 | Horizontal wiring |
| 25 | Insulating material on the circuit board |
| 26, 26n | Laminated protective layer |
| 27 | Laminated rewiring coating protective layer |
| 28 | Inter-layers of the upper and lower integrated circuit chip components conducting units |
| 30 | Vertical conducting units on the integrated circuit chip |
| 36 | External connection protective layer and external connection terminal |
| 39 | Terminals on the circuit board |
| 40 | Wiring terminal |
| Y ta | Via wiring that connects between all of upper and lower integrated circuit chip components from the wire substrate terminals |
| Ytb1, Ytb2, Ytb3, Ytbn | Via wiring that selectively connects the upper and lower integrated circuit chip components from the wire substrate terminals |
| Y ia | Via wiring that connects between all of upper and lower integrated circuit chip components from the intra-module integrated circuit chip components |
| Yib1, Yib2, Yibn | Via A wiring that selectively connects the upper and lower integrated circuit chip components from the intra-module integrated circuit chip components |
| Xa1, X am | Horizontal wiring that connects between all of the integrated circuit chip components in the crosswise direction from the intra-module integrated circuit chip components |
| Xb1, Xb2, Xb3, Xbn | Wiring that selectively connects the integrated circuit chip components in the crosswise direction from the intra-module integrated circuit chip components |

BEST MODE FOR CARRYING OUT THE INVENTION

A best mode of the present invention will be described as follows:

It should be noted that the following description of the embodiments is explained in detail in order to have a better understanding of the original point in the present invention. Therefore, the description is not limited to the present invention unless otherwise specified.

FIGS. 1 to 9 are cross-sectional views for explaining the fabrication method for the terminal unit formation area expanded type integrated circuit chip components in order of the processes, while FIGS. 4 to 7 are enlarged views illustrating the fabrication processes of the single integrated circuit chip components. A numeral reference 10 in these drawings denotes cross-sections of the terminal unit formation area expanded type integrated circuit chip components of a first embodiment, according to the present invention through the processes shown in FIGS. 1 to 9. It should be noted that scales, dimensional ratios and wiring numbers for each section are conveniently adjusted for the interior wiring and the interior structure to be better viewed in these cross-sectional views and cross-sectional views to be shown later.

[Structure of the Integrated Circuit Chip Components]

Figure 7:
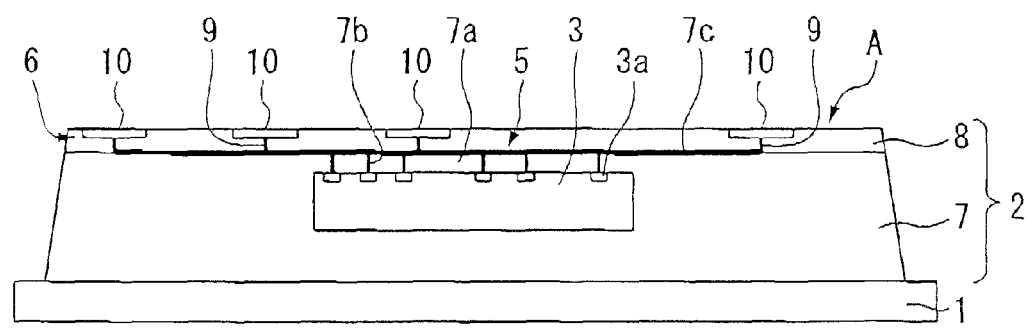
FIG. 7 is a cross-sectional view of the vertical conducting units and the terminal unit formed on the expanded wiring unit.

The terminal unit formation area expanded type integrated circuit chip components A of the first embodiment, according to the present invention illustrated in FIG. 7, includes a protective layer 2 made of insulation materials formed on a substrate 1, an integrated circuit chip module 3 embedded almost parallel to the substrate 1 at the upper side of the protective layer 2, an expanded wiring unit 5 formed to a terminal unit 3a of the integrated circuit chip 3, so as to be electrically connected; the expanded wiring unit of which vertical or horizontal width is expanded to the upper side of the integrated circuit chip 3 is longer than the integrated circuit chip 3; a surface expanded terminal unit (realigned terminal unit) 6 formed on the upper surface of the protective layer 2; the surface expanded terminal unit is electrically connected to the terminal unit 3a of the integrated circuit chip 3, via the expanded wiring unit 5.

The integrated circuit chip 3, illustrated in FIG. 7, is a bare chip, such as LSI and IC, equipped with various integrated circuits in its interior; wherein respective input and output terminals of the integrated circuits connected to the terminal unit 3a with joint materials, such as wire bonding and bump, are sealed by a sealing resin made of the insulating materials. As an example of the integrated circuit chip 3, various types are available, including those equipped with an enhanced functional type integrated circuit known as Central Processing Unit (CPU), and a memory element known as Memory, whereby various types can be used, including a large CPU with more than 1000 terminals and a Memory with less than 100 terminals. Although FIG. 7 illustrates an example of six terminal units 3a, described on the upper surface (the terminal unit formation surface) of the integrated circuit chip 3, in order to simplify the explanation, actual applicable integrated circuit chips are equipped with at least as few as 10, or more than 1000 terminal units 3a. Of course, the present invention may apply those with the terminals out of this range.

Although whichever the substrate 1 can be used, either with an insulating property or a conducting property, the substrate 1 must possess strength and flatness capable of handling, also capable of covering or attaching with some adhesion, and detaching the protective layer 2 to be formed on the substrate.

The protective layer 2 is composed of polyimide (PI) resin, phenol resin, optical photoconductive thermosetting resin, such as BCB, OXA, and ZOLE, or general optical non-photoconductive organic based insulating materials, such as curable resins, including heat and light, non-organic materials represented by spin-on glass (SOG), and organic and non-organic based mixed materials, or TEOS based or other CVD insulating materials, or those generated by mixing curing of covering based materials. The protective layer 2 is formed with, proper thickness so as to embed the integrated circuit chip 3 in its interior. The thickness of the protective layer 2 is, thus appropriately modifiable subject to the thickness of the integrated circuit chip 3. Although the resins that compose of the protective layer 2 are not limited to the aforementioned optical photoconductive thermosetting resin and the optical non-photoconductive thermosetting resin, it is preferred to use resins with small, contraction ratios in cases of using an ultrathin integrated circuit chip 3 because thermosetting resins have large thermal contraction ratios that thermal stress serves to the integrated circuit chip 3; owing to the thermal contraction of the thermosetting resins when the integrated circuit chip 3, with the thickness of 100 μm or less is applied, possibly causing a chip split or loss. Furthermore, the integrated circuit chip components A includes the protective layers covered on the upper and lower surfaces of the chip to maintain a balance of the stress applied to the chip as a solution of thin, type chips.

The protective layer 2 is composed of a lower protective layer 7 and an upper protective layer 8; wherein the lower protective layer 7 is formed so as to cover the entire integrated circuit chip 3 and have a coating unit 7a placed with a thickness of a few μm on the terminal unit 3 mounted at the upper surface and upper side of the integrated circuit chip 3. The coating unit 7a positioned above the integrated circuit chip 3 includes via holes formed; the via holes run the coating layer 7a through the direction of its thickness, wherein lower via wirings (upper interior and lower conducting units) 7B are formed along the positions of respective terminals 3a inside the via holes; the via wirings are connected to the terminal 3a of the integrated circuit chip 3, reaching to the upper surface of the coating unit 7a, wherein an expanded wiring unit 5 is formed on the upper surface of the coating unit 7a; on the expanded wiring unit, a plurality of the wiring units 7c respectively connected to the plurality of the lower via wirings 7b formed. These wiring units 7c are formed wider than the vertical or horizontal width of the plane state in the region where the terminal unit 3a of the integrated circuit chip 3 is formed. Although FIG. 7 illustrates an example of the wiring unit expanded about twice as wide of the horizontal width of the integrated chip 3, size may be arbitrarily expanded, subject to test or burn-in test sockets or prober terminals; all of the electric characteristics tests can be implemented, including a high, frequency test. For example, a terminal pitch of the socket for the current tip test and the burn-in test is currently between 80 μm and 90 μm. These are extremely smaller than the minimal pitch 300 μm of the current package products, but larger than the minimal pitch 20 μm on the chip.

The upper protective layer 8 is formed by coating the lower protective layer 7 and the expanded wiring unit 5 formed above, and its thickness is supposed to be a few μm. The upper protective layer 8 positioned above the expanded wiring unit 5 includes via holes formed; the via holes run the upper protective layer 8 through the direction of its thickness connecting to the wiring unit 7c of the expanded wiring unit 5, reaching to the upper surface of the upper protective layer 8; wherein a plurality of the upper via wirings made of conductive materials (the upper exterior and lower conducting unit) 9 is formed along each of the wiring units 7c in the via holes, and on the upper surface of the upper protective layer 8, a plurality of the wiring units (surface expanded terminal units) 10 respectively connected to the plurality of the upper via wirings 9 formed.

Although the terminal unit formation area expanded type integrated circuit chip components A, of which structure is set forth hereof, includes a thin and compact integrated circuit chip 3 contained inside; its terminal unit 3a has a structure in such that search needles of the prober in a general inspection device are aligned to a fine region or a fine pitch that a purpose of the mass productivity cannot align. For example, even though they are aligned in such a fine region or a fine pitch, so that search needles of a prober in a universal inspection device, capable of inspecting high frequency with a few 100 MHz or higher, cannot implement a burn-in test; the integrated circuit chip 3 expands an area and forms a pitch in a wide region to use a terminal unit 10, of which the area is also enlarged for implementing sufficient electric characteristics and burn-in inspections. An area can be smaller than a terminal area of the integrated circuit chip 3, along with the development of future socket technology. Terminals can be aligned surrounding the integrated circuit chip 3, in order to avoid mechanical pressure applied on the integrated circuit chip 3 when the sockets are contacted.

It should be noted that the layout of aligning the terminal unit 3a of the integrated circuit chip 3 is not always the same as the layout of aligning the terminal unit 10 of the components. The layout of aligning the terminal unit 10 of the components is fixed, so it is best for an electric characteristics test and the wiring of the integrated circuit chip components A to be integrated.

Figure 14:
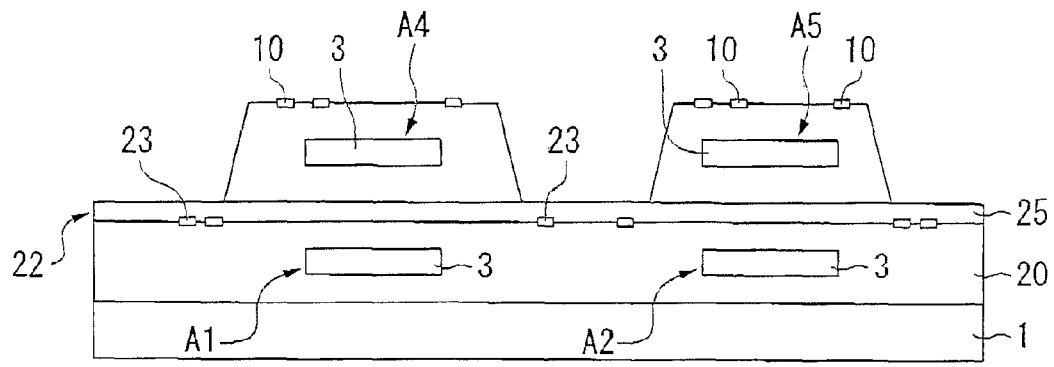
FIG. 14 is a cross-sectional view of the integrated circuit chip components laminated with two layers on the platform.

Thinner sizes of the integrated circuit chip components A contains higher integrated density of laminations. For example, it is possible to adjust via wiring unit with less than 15 μm in size in the integration process of a module thickness under the total of 30 μm, and a hole for forming via wiring unit can be easily formed even though etching is not available. If a size is further thinned, all of the patterning can be processed by image development (in case of using optical photoconductive resin) or etching, including via wiring. It should be noted that the shape of the integrated circuit chip components A has a slight gradient and tapers at the sides so that the sides are completely coated with, resin as FIG. 14 illustrates.

The terminal unit formation area expanded type integrated circuit chip components A, of which structure is set forth hereof, can provide non-defective integrated circuit chip components A adapted to the integrated circuit chip 3; it can be judged as a complete non-defective product because there's no damage and yield loss after the inspection process occurs, as it is the final process; the integrated circuit chip 3 is further coated with, the protective layer 2 made of insulating material, so that the semiconductor circuits and components mounted inside the integrated circuit chip 3 are structured in a dual sealing, resulting in excellent reliability provided, and its product test can easily implement inspections, including high frequency by using a universal inspection device through the area-expanded terminal unit 10. As a result of only using the integrated circuit chip components A, it can be judged as a non-defective product for the integration as described herein after, a multi-chip module with, an extremely low percentage for causing defects can be obtained as described hereafter. Furthermore, these modules can be further integrated; however, the structure will be described later.

[Fabrication Method of the Integrated Circuit Chip Components]

Next, the fabrication method of the terminal unit formation area expanded type integrated circuit chip components A, of which structure is illustrated in FIG. 7, is explained according to FIGS. 1 to 9. In order to fabricate the integrated circuit chip components A, a resin film acts as an insulator, or a coating type resin insulation layer 12 is formed on the substrate 1, as illustrated in FIG. 1, then necessary pieces of the integrated circuit chips 3 are mounted on it with predetermined intervals with the terminal unit facing upward. The integrated circuit chips 3 used herein, are judged as non-defective products, as a result of a probe test in advance held by a normal inspection device, then inspections such as general conductivity tests are held. However, the integrated circuit chips 3 may be used without a high frequency test and other tests that are difficult on the prober; as well as the burn-in test, which is difficult on the wafer because the prober of the inspection device is not high frequency supported, or a high frequency supported inspection device is so expensive that it is difficult to use such a device for a normal inspection. The integrated circuit chips 3 are normally thinned by a back grinder or etching liquid, however, films or resins may also be adhered to their reverse surfaces because distortions become larger when the thickness is 100 μm or less.

Figure 2:
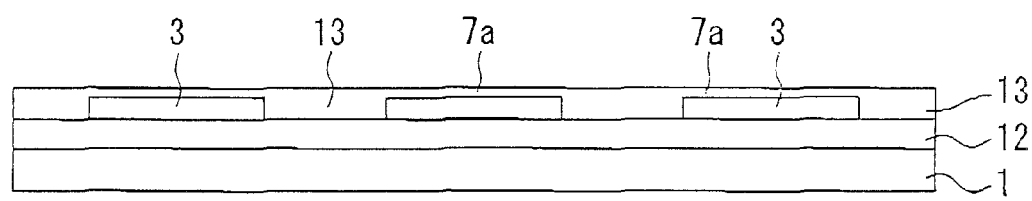
FIG. 2 is a cross-sectional view of the upper protective layer formed around the integrated circuit chip on the platform.
Figure 3:
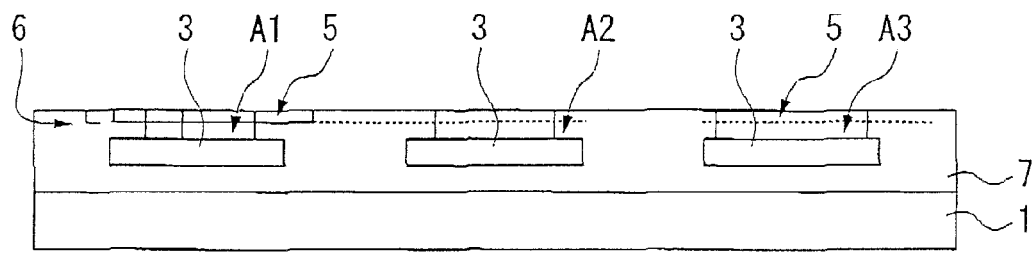
FIG. 3 is a cross-sectional view of the integrated circuit chip component before a test is loaded in the integrated circuit chip on the platform.

It should be noted that the terminal units of the integrated circuit chips 3 are omitted in FIGS. 1 to 3, in order to simplify the explanation, describing a case of fabricating three integrated circuit chips 3 on the substrate 1. On the substrate 1, however, required units of the integrated circuit chips 3 to be manufactured and mounted in accordance with an area size of the substrate 1.

Next, coated insulating layers 13 is formed, as FIG. 2 illustrates, by coating resins, such as phenol based photoconductive resin, so as to coat above the resin insulating layers 12 and the integrated circuit chips 3.

The coated insulating layers 13 herein may apply a few μm in thickness coat to the upper surfaces (terminal formation surfaces) of the integrated circuit chips 3. For example, phenol based optical photoconductive resins, if used, may be exposed at H, G and I lines. Since these based resins contain high temperature resistance at 300° C., permittivity 3.7, curing temperature at 190° C., contraction at the time of curing 10%, aspect ratios between 1.0 and 2.0, excellence in chemical resistance and their thickness ranges can easily be adjusted between 3 μm and 25 μm; they can be preferably used for the purpose of the present invention.

The coated insulating layers 13 are coupled and unified with, their lower resin insulating layers 12, by means of curing the coated insulating layers 13 with prebaking and heat treatment to form the protective layers 7 that coat the integrated circuit chips 3, and the expanded wiring units 5 are formed by processing the protective layers 7. Furthermore, the thickness of the coating unit 7a is formed so as to form via wirings for vertical conduction to be described hereafter.

The expanded wiring units 5 are formed on each of the integrated circuit chips 3 from the above state, as FIG. 3 illustrates. A method for forming these expanded wiring units 5 is described below based on partial enlarged views, as FIGS. 4 to 6 illustrates.

Figure 4:
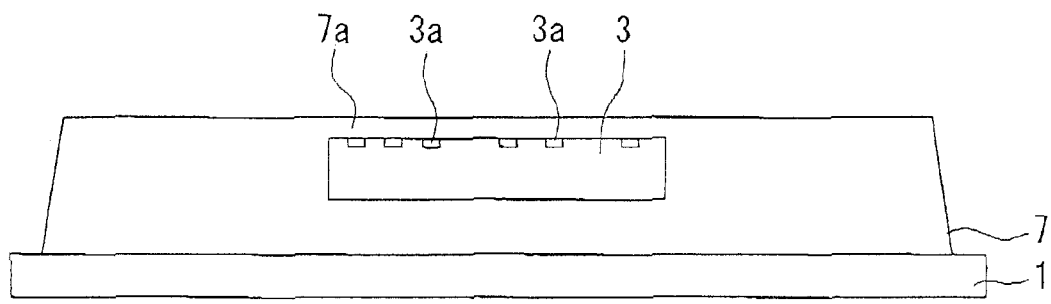
FIG. 4 is a cross-sectional view of one integrated circuit chip embedded inside the protective layer on the platform.
Figure 5:
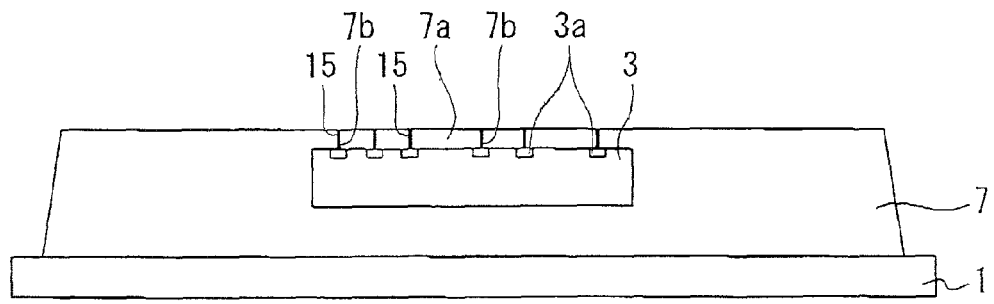
FIG. 5 is a cross-sectional view of the vertical conducting units formed in the coating layer on the integrated circuit chip.
Figure 6:
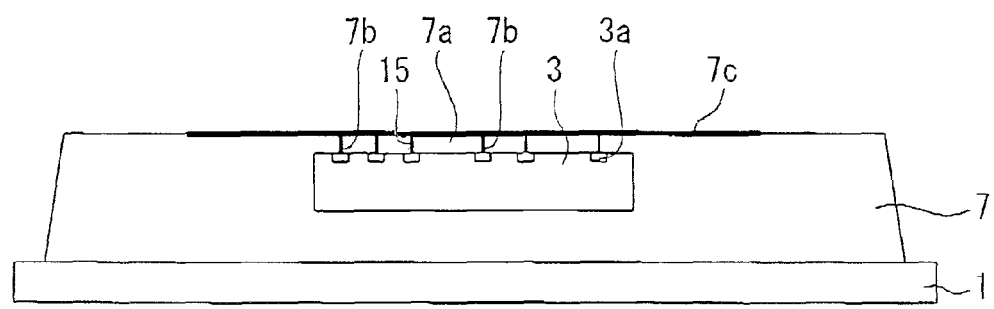
FIG. 6 is a cross-sectional view of the expanded wiring unit formed on the coating layer.

In order to form the expanded wring units 5, as FIG. 4 illustrates, surrounding sections of one integrated circuit chip 3 in enlarged view; the coating unit 7a is formed at the upper side of the terminal units 3a, in the integrated circuit chips 3, on the protective layer 7 surrounding the integrated circuit chips 3, so as to cover the terminal units 3a, so that the coating unit 7a is processed with a mask, not illustrated herein, as well as a photolithographic process for exposure and etching, and via holes 15 communicated with each of the terminal units 3a are formed, as FIG. 5 illustrates; wherein lower wirings 7b (upper interior and lower conducting units) are formed via holes 15 by means of a seed layer sputtering and plating, or a film formation method, such as evaporation coating. One example describes that the lower via wirings 7b, made of conducting materials, can be formed only inside via holes 15 by means of forming films via holes 15 and their surroundings, or plating the same, thereafter covering and forming resist materials on these films and plating layers, partially exposing and image developing the resist materials, and removing the resist materials with etching, except the resist materials in the section where conducting materials are filled.

A typical photo lithography step using the phenol based resins can be applied by covering resin layers composing the protective layers 7, thereafter through a series of steps from pre-baking at 110° C./3 minutes, illuminating light 300 mJ/cm$^2$, post-exposure baking at 110° C./3 minutes, image development at 2.38%/60 minutes, lines for 30 seconds and post-baking at 190° C./60 minutes; including environment measure, at a low temperature process. Even the following photo lithography step can basically provide the same process only with the amount of time changed depending on the thickness of bare chip used.

The expanded wiring units 5 can be formed by means of forming a lower via wiring 7b, thereafter forming a wiring 7c on the upper surface of the lower protective layer 7; the wiring 7c is connected to the lower via wiring b. A wiring unit 7c can be formed by means of forming mask materials on the upper surface of the lower protective layer 7, thereafter processing photo lithography steps conducting exposure, image development and selective etching, or forming plating layers as wiring circuits; in other words, employing a general means at the time of forming wiring circuits on the substrate, such as compressing a thin body made of conducting materials and forming wiring circuits.

Wiring is basically arranged by plating; more specifically, seed layers, such as Ti, Cr are piled to the foundation by sputtering, wiring patterns are arranged by plating resist resistance, the resist detachment, seed layers etching are conducted after plating, then wiring is provided with insulating materials.

When the wiring unit 7c is formed, an upper protective layer 8 is formed on the lower protective layer 7 by using methods of covering resins, covering or attaching resin films, and the lower protective layer 7 is coupled to the upper protective layer 8 with pre-baking and heat treatment.

Thereafter, an upper via wiring 9 is formed in the same manner of forming the lower via wiring 7b, and forming terminal units (surface expanded terminal units) 10 on the upper surface of the upper protective layer 8, it allows the terminal unit formation area expanded type integrated circuit chip components A to be obtained, as FIG. 7 illustrates its structure.

The above descriptions are specified while actual fabrication may fabricate a wiring 7b, a wring unit 7c, an upper via wiring 9 and terminal units 10 in the simultaneous process in the steps of resist pattern and image development, foundation plating etching and insulation layers covering in order to improve the productivity. Furthermore, a single layer, as well as multi-layers can be applied for horizontal wiring. Its step is similar to a realigned wiring step, which currently provides mass production of the components on a wafer level, to be processed on the substrate.

According to the above described method, the terminal unit formation area expanded type integrated circuit chip components A can be easily provided with the combination of general means, separately implemented for the semiconductor circuit fabrication, more specifically, it is fabricated by means of forming the resin insulating layer 12 on the substrate 1, mounting the integrated circuit chips 3 on it, forming the coating insulating layer 13, forming via holes 15 with the photo lithography steps applied; wherein the lower via wiring 7b made of conductive materials for the vertical conduction are formed in their interior, forming the expanded wiring units 5, further forming the upper protective layer 8; wherein the upper via wirings 9 and the terminal units 10 are formed.

The steps of fabricating the integrated circuit chip components A, thus cannot be more cumbersome than those of forming general circuits.

When the integrated circuit chip components A with the structure, as FIG. 7 illustrates, an electric characteristics test is implemented to the component; the test includes all of the electric characteristics, in other words, the functionality, high frequency, AC and parameters. A burn-in test is also implemented in case of removing the initial reliability defects.

Figure 8:
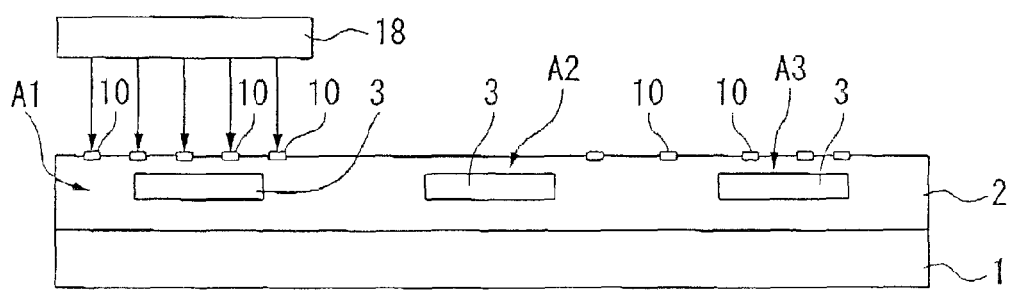
FIG. 8 is a cross-sectional view of the integrated circuit chip inspected by the prober (or the socket) via the terminal unit.
Figure 9:
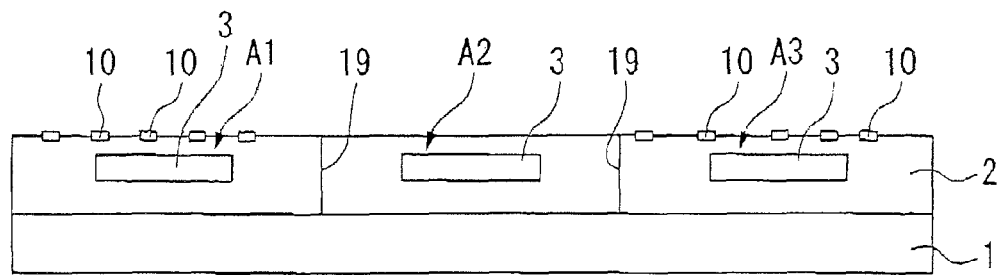
FIG. 9 is a cross-sectional view illustrating the position mounted inside the embedded protective layer on the platform to cut the integrated circuit chip.

Although FIG. 8 simply illustrates these units aligned in a continuous state on the substrate, a complete test is actually implemented even in case no prober present is available for the above test, by means of separating and using test sockets and burn-in sockets, and fitting the terminal units 10 of the integrated circuit chip components A to the socket terminals, in order to judge non-defective products. Formation pitches and formation regions of the terminal units 10 are in enlarged formation herein in comparison with the formation pitches and the formation regions of the terminal units 3a in the integrated circuit chips 3, so that all of the test categories can be implemented, including frequency.

More specifically, the integrated circuit chip components A of the present invention is judged whether it is a complete product that exercises all of the functions, including reliability and high frequency characteristics, or it is a defective product.

As a result, of judging non-defective and defective products by the test implemented to all of the integrated circuit chip components A on the substrate 1, as FIG. 8 illustrates; only those judged as non-defective products are aligned on the insulating protective layers on the substrate in order to fabricate multi-chip modules in the first layer, in which integration is processed.

Figure 10A:
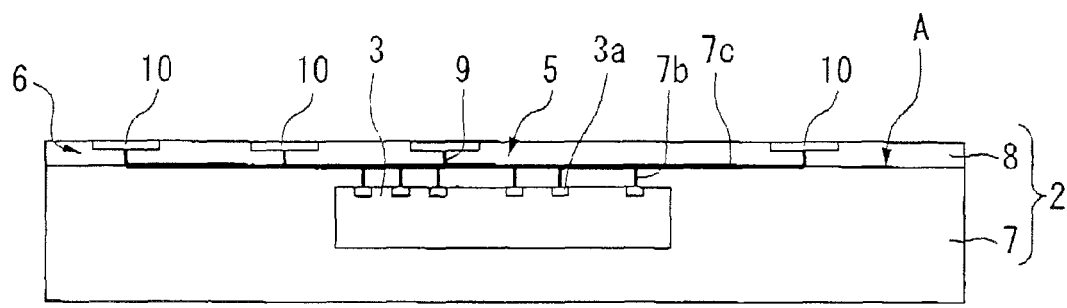
FIG. 10A is a cross-sectional view of the terminal unit formed area expanded type integrated circuit chip components having the integrated circuit chip inside the protective layer.
Figure 10B:
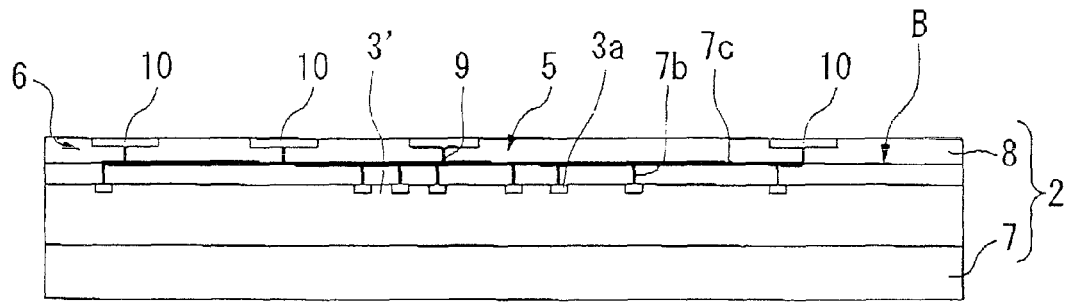
FIG. 10B is a cross-sectional view of the terminal unit formed area identical type integrated circuit chip components having the integrated circuit chip inside the protective layer.

The terminal unit formation area expanded type integrated circuit chip components A structured, as FIGS. 10A and 10B illustrate, are features that ultrathin type integrated circuit chips 3 is handled with the least risks of split and loss because the protective layer 2, made of instating materials, are covering around them; for example, even with a 10 μm or less thickness, possibly causing split and loss and are impossible to be handled. Furthermore, there's no damage and yield loss after the inspection process occurs, as the inspection step is the final process.

Next, in case test terminals on the protective layers of the integrated circuit chips that are integrated are extendedly wired in identical areas; in other words, these test terminals connected through rewiring connected from the test terminals of the integrated circuit chips in the protective layer are on the same surface area as the surface area of the integrated circuit chips; no initial reliability defects occur, even without probing on the wafer and implementing a burn-in test by wafer level burn-in maturing products. In case KDG is assured by adding steps (such as cutting) after the inspection, the terminal unit formation area identical type integrated circuit chip components B, as illustrated in FIG. 10B, is indicated as a component for the module.

The terminal unit formation area expanded type integrated circuit chip components B of this example is fabricated by means of aligning the rewiring of the integrated circuit chip terminals and the terminals to the protective layer, made of the insulating materials on the wafer level; thereafter with a probe test, and the wafer level burn-in and the cutting steps, which may be omitted. However, formation of the terminal connections on the protective layer, such as bump and solder, as found in the wafer level packages, is not necessary but the terminals for plating wiring connection. In case the thickness of the chips is 50 μm or less, the lower protective layer 7, made of the insulating materials, is necessary at the lower surface of the chips because of the same reason as the terminal unit formation area expanded type integrated circuit chip components. The lower protective layer may be covered on the surface sides for improving the quality. Therefore, the structure, as illustrated in FIG. 10B, is also available. More specifically, the lower protective layer 7 is covering both sides of the integrated circuit chip 3' with proper thickness, even though the integrated circuit chip 3' is not exposed to the sides of the integrated circuit chip components B.

[One-Layer Single Chip Module and Multi-Chip Module Laminated with the Multi-Chip Module]

Next, described is a method for fabricating laminated multi-chip modules by means of using the integrated circuit chip components A, separated from the substrate 1, as illustrated in FIG. 10A, structuring a one-layer single chip module and a multi-chip module, further laminating the same for three-dimensional conversion. Although the terminal unit formation area expanded type integrated circuit chip components A is mainly explained below as a component the terminal unit formation area identical type integrated circuit chip components B, or combination of these types can be used.

Required units of the integrated circuit chip components A, which are fabricated at the previous step and already judged as non-defective products, are aligned with intervals between the units on the substrate 1 for one layer via coating resin layers or resin layers, such as resin films. As an example, an aspect of the embodiments hereof describes that laminated multi-chip module is fabricated by means of aligning and forming the integrated circuit chip components A1, A2, and A3 on the substrate 1, as illustrated in FIG. 11, connecting on the horizontal wiring 22 respective terminals of those requiring connection among these integrated circuit chip components A1, A2 and A3 as needed, and structuring one-layer multi-chip module C.

Resins are applied to these integrated circuit chip components A1, A2 and A3, so as to surround these components with a few 10 μm coat on them. Then the resin layers are cured to structure the protective layer 20 that is covering the integrated circuit chip components A1, A2 and A3. A horizontal wiring unit 22 and wiring are formed on the protective layer 20; the horizontal wiring unit 22 connects the integrated circuit chip components A1, A2 and A3 by means of applying to the coating layer 21, which is coating the upper sides of the integrated circuit chip components A1, A2 and A3, the photo lithography step in the same manner of the photo lithography step in the fabrication step of the integrated circuit chip components A, while the wiring is extracting the terminals 10 of these A1, A2 and A3 in the vertical, direction. The terminal units 23 are respectively formed so as to be exposed to the upper surface of the coating layer 21.

The above descriptions are specified while actual fabrication may fabricate the horizontal wiring units 22, the wiring in the vertical direction and the terminal units 23 in a simultaneous process as in the steps of resist pattern and image development, foundation plating etching and insulation layers coating in order to increase productivity. Furthermore, a single layer as well as multi-layers can be applied. Its step is similar to a realigned wiring step, which currently provides mass production of the components on a wafer level, to be processed on the substrate 1. The integrated circuit chip components A1, A2 and A3 are basically adhered and unified to the module with heat curing caused by hard baking of the resins before forming respective wiring (plating) patterns. A structure in which a plurality of the integrated circuit chip components A1, A2 and A3 are arranged in one layer can be referred to as one layer Multi Chip Module C. A structure in which only the integrated circuit chip components A1 is arranged in one layer can be referred to as 1 layer Single Multi Chip Module.

Figure 11:
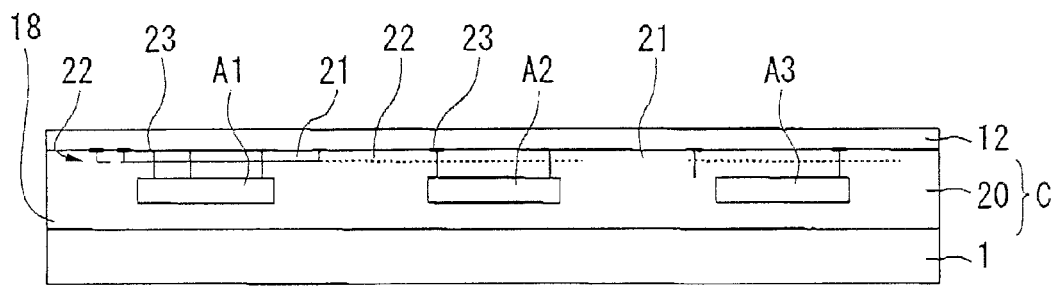
FIG. 11 is a cross-sectional view of the integrated circuit chip components mounted inside the protective layer on the platform.
Figure 12:
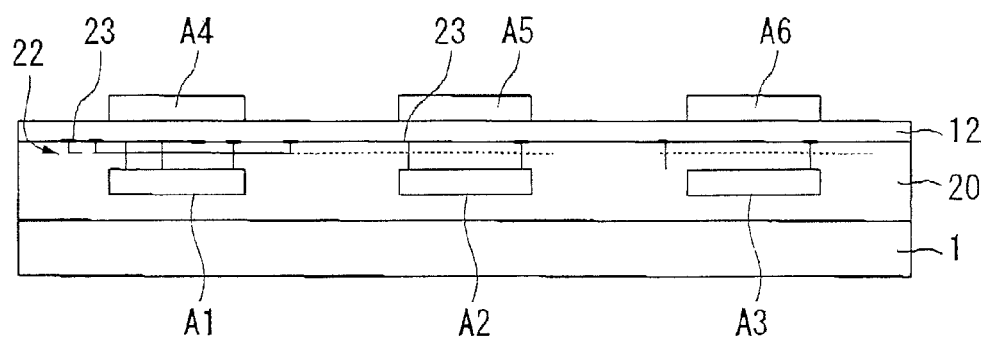
FIG. 12 is a cross-sectional view of the integrated circuit chip components laminated with two layers on the platform.

Next, in order to laminate the second layer to the integrated circuit chip components, a medium layer 25, such as coated resin layers or resin films, are formed so as to coat the upper surface of the coating layer 21 and the terminal units 23 and prebaked, as illustrated in FIG. 11; so that the integrated circuit chip components laminated with the multi chip module in the lower layer are unified. The integrated circuit chip components A4, A5, and A6, which are fabricated in the same manner as the previous step and already inspected as non-defective products, are aligned on the medium layer and evenly stacked on the first layer of the integrated circuit chip components A1, A2 and A3, as illustrated in FIG. 12.

Figure 13:
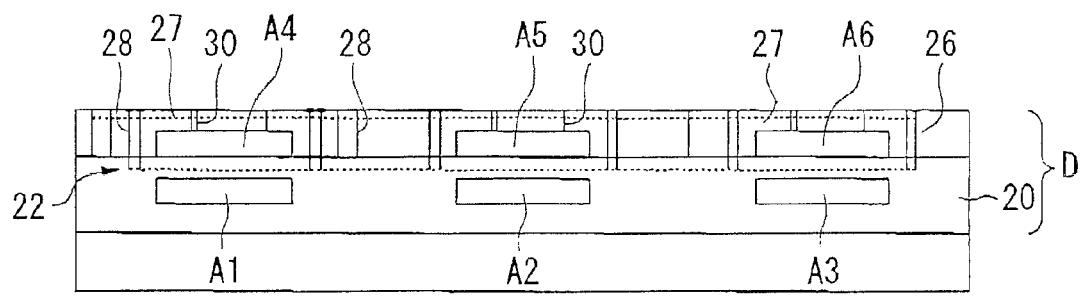
FIG. 13 is a cross-sectional view of the integrated circuit chip components at the second step on the platform surrounded by the protective layer.

Then, protective layers 26 are formed around the integrated circuit chip components A1, A2 and A3, and coating layers 27 are formed at their upper sides, as illustrated in FIG. 13. Next, via holes that run through the protective layers 26, and the coating layers 27 are formed by the photo lithography step or laser radiation, while the multi chip module in the lower layers, and the protective layers 26 and the coating layers 27, as well as the integrated circuit chip components A4, A5 and A6 are unified. Then, vertical conducting units 28, made of conducting materials, are formed; and via holes are formed at the coating layers 27 on the integrated circuit chip components A1, A2 and A3 by the photo lithography step or the laser radiation in the same manner applied as the previous step, forming an vertical conducting unit 30 made of conducting materials on those via holes.

These vertical conducting units 28 and 30 allow the integrated circuit chip components A1, A2, and A3 in the first layer and the integrated circuit chip components A4, A5 and A6 in the second layer to be derived onto the coating layer 27 on the highest layer. A horizontal rewiring and terminals for further laminated layers or external connection are further formed on the protective layer (similar to the horizontal wiring units 22 and 23 in the first layer); the horizontal rewiring selectively connects the terminals formed on the coating layers 27 and the vertical conducting units 30 from the integrated circuit chip components A4, A5 and A6. The integrated circuit chip components A4, A5 and A6 in the second layer are also adhered and unified to the module with heat curing caused by hard baking of the resins before forming respective wiring (plating) patterns.

From the above steps, a 2 layer-structured multi-layer module D, that includes the integrated circuit chip components A1 to A3 in the first layer, and the integrated circuit chip components A4 to A6 in the second layer, known as 2 Layer Multi Chip Module can be obtained. The multi-layer module D can be referred to as a Single Chip 2 Layer Module, since the integrated circuit chip components used for each layer apply only A1 and A4 with single chips.

Figure 15:
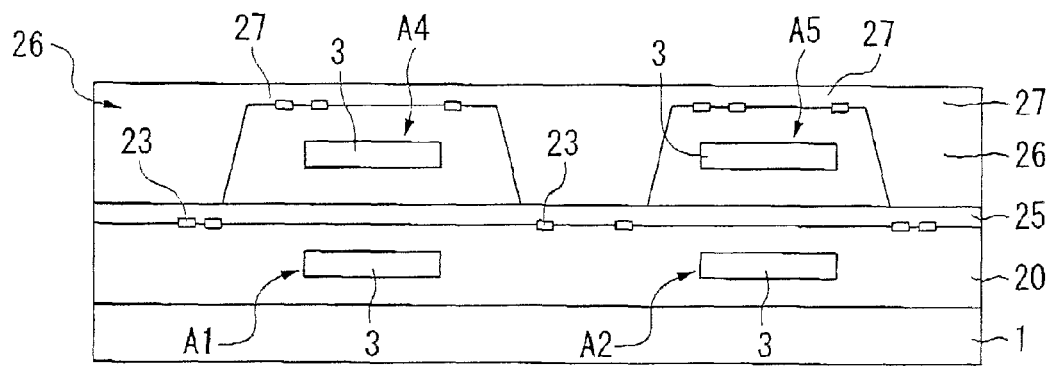
FIG. 15 is a cross-sectional view of the integrated circuit chip components at the second step on the platform surrounded by the protective layer.
Figure 16:
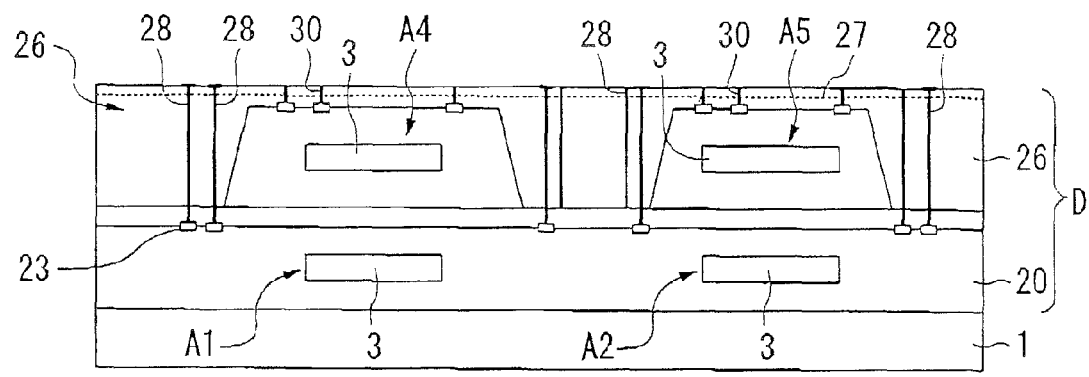
FIG. 16 is a cross-sectional view of wiring surrounding the integrated circuit chip components at the second step.

Although description of the above steps abbreviates the integrated circuit chip components A1 to A6 to chip-shaped in FIGS. 11 to 13, the structures of these integrated circuit chip components A1 to A6 are described in FIGS. 14 to 16 in more detail.

FIG. 14 illustrates the same state, as in FIG. 12, and FIG. 15 illustrates a state in which the protective layer 26 and the coating layer 27 are formed around and above the integrated circuit chip components A4 and A5 in the second layers; while FIG. 16 illustrates a state in which the vertical conducting units 28 and 30 are formed in the protective layer 26 and the coating layer 27 in the second layers. A horizontal wiring and terminals for further laminated layers or external connection are further formed on the protective layer (similar to the horizontal wiring units 22 in the first layer); the horizontal wiring selectively connects the vertical conducting units 28, formed on the coating layers 26 and the vertical conducting units 28, from the integrated circuit chip components A4, A5 and A6. The above descriptions are specified while actual fabrication may fabricate the horizontal wiring units 22, the horizontal wiring units 22 and 23 in the simultaneous process in the steps of resist pattern and image development, foundation plating etching and insulation, layers coating, in order to increase productivity. Furthermore, a single layer as well as multi-layers can be applied. Its step is similar to a realigned wiring step, which currently provides mass production of the components on a wafer level, to be processed on the substrate.

Figure 17:
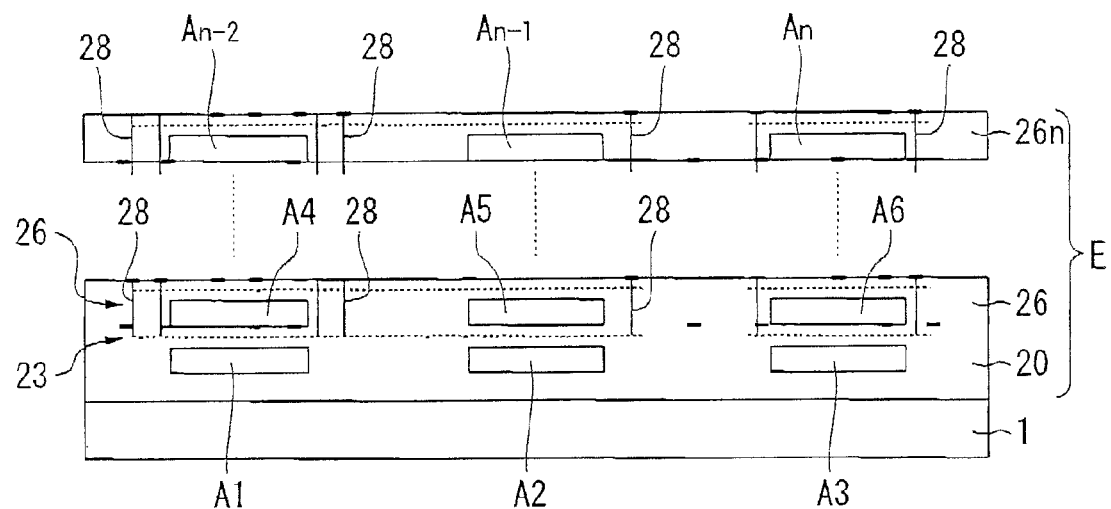
FIG. 17 is a cross-sectional view illustrating one example of the multi-layer chip module.

In case where the two-layer structured multi chip module D, as illustrated in FIGS. 14 and 16, is further multi-layered by laminating layers; laminating layers of the integrated circuit chip components may be repeated until the target number of the layers, as illustrated in FIG. 17. A protective layer 20 and a multi-module E can be obtained accordingly. The protective layer 20 is equipped with the integrated circuit chip components A1, A2, A3, An−1, An−1 and An (n is a counting number in accordance with the numbers of the integrated circuit chip components to be used), while the multi-module E is equipped with 26 to 26n.

In the multi-layer module of this structure, respective terminal units of the first layered integrated circuit chip components A1, A2 and A3 are connected to the vertical conducting units 28 via the horizontal wiring units 22, and these terminal units are connected to the one-uppermost upper layer and lower conducting units 28, so as to run through the protective layer upward, and sequentially reaching to the vertical conducting unit 28 in the highest layer 26n via the uppermost upper layer and lower conducting units 28 with the wiring extended to the upper surface of the multi-layer module E.

Figure 18:
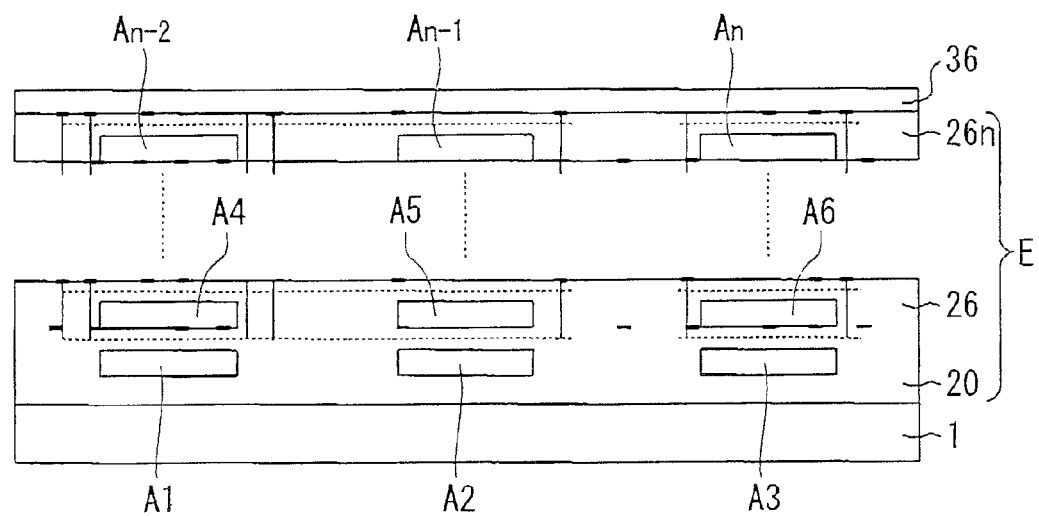
FIG. 18 is a cross-sectional view of the external connection layer and the terminals aligned on the multi-layer chip module.
Figure 19A:
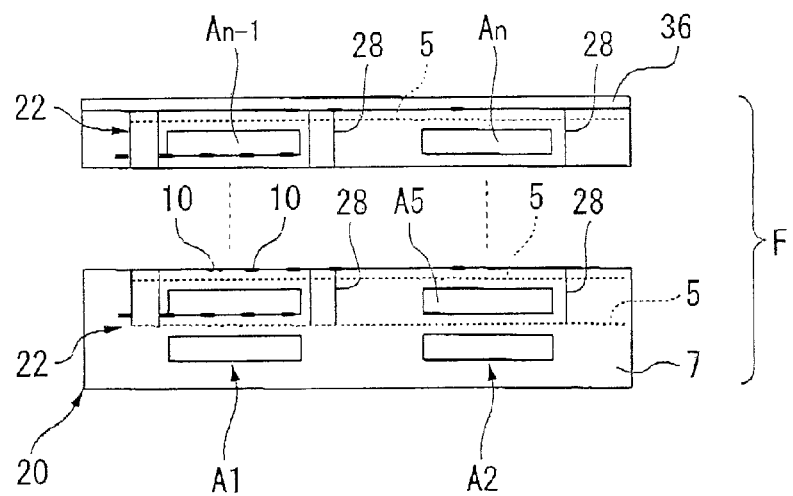
FIG. 19A is a cross-sectional view of the multi-layer chip module separated from the platform.

FIG. 18 illustrates a state of a medium layer 26 for the terminal connection formed on the surface of the multi-layered multi-layer module E. Processing the medium layer 36 in the photo lithography step into necessary circuit shapes and terminal shapes allows the exterior connection terminals and the connection circuits, as the multi-layer module E, to be formed on its upper surfaces. FIG. 19A illustrates a product structure of the multi-chip module F configured with the terminal unit formation area expanded type integrated circuit chip components A, while FIG. 19B illustrates a product structure of the multi-chip module F2 configured with the combination of the terminal unit formation area expanded type integrated circuit chip components A and the terminal unit formation area identical type integrated circuit chip components B, or any of these integrated circuit chip components.

Figure 19B:
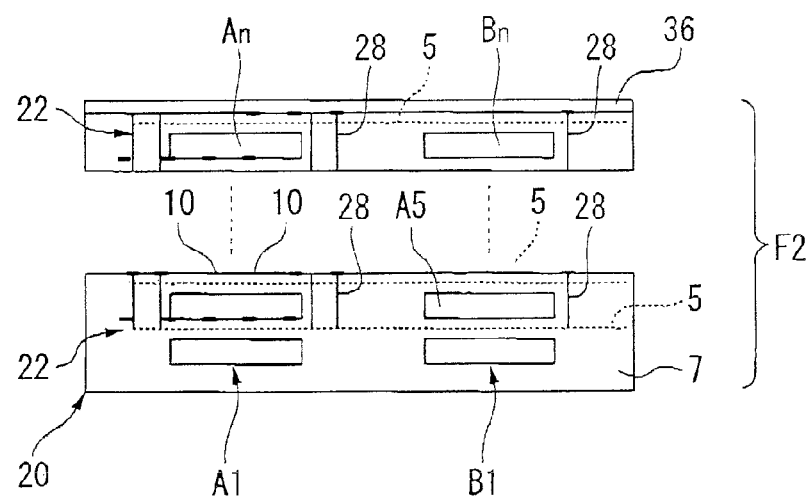
FIG. 19B is a cross-sectional view illustrating mixture of the terminal unit formed area identical type integrated circuit chip components A1 to An, and the terminal unit formed area identical type integrated circuit chip components B1 to Bn.
Figure 20:
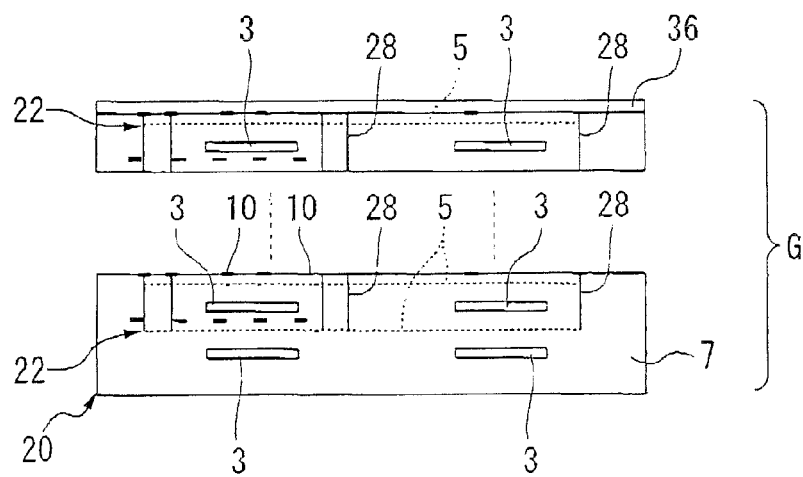
FIG. 20 is a cross-sectional view of the multi-layer chip module.

FIGS. 19A, 19B and 20 illustrate that the integration of the integrated circuit chip components A from 1 to An, and B1 to Bn, illustrated in FIG. 19B, is the integration of the integrated circuit chip 3, as illustrated in FIG. 20. As FIG. 20 illustrates, a structure of the multi-layer module G, that has incorporated and laminated the integrated circuit chip 3, may be employed.

FIGS. 21 to 26 illustrate embodiments of a printed circuit board 40 used for the present invention, instead of the base 1 used in the embodiments as described above. The printed circuit board 40 includes printed circuits already formed.

The steps includes: A medium layer 25 equivalent to that used in the above embodiments is formed on the printed circuit board 40 with the printed circuits formed, then the integrated circuit chip components A1 to An of the above structure are mounted on the medium layer 25, and protective layers 20 and coating layers 27 are formed in the same manner as the above embodiments, so as to cover these integrated circuit chip components A1 to An; wherein the coating layers 27, that have covered the upper integrated circuit chip components A, are applied with the same photo lithography step, as done in the fabrication step of the integrated circuit chip components A and a horizontal wiring unit 22 aligned in the horizontal direction is accordingly formed; the horizontal wiring unit 22 connects the integrated circuit chip components A1 to An, and terminal units are formed on the upper surfaces of the coating layers so as to be exposed.

These steps can provide the multi-chip module H equipped with a plurality of the integrated circuit chip components A.

In this embodiment, the terminal unit formation area expanded type integrated circuit chip components A can be appropriately selected and combined with the terminal unit formation area identical type integrated circuit chip components B.

Figure 25:
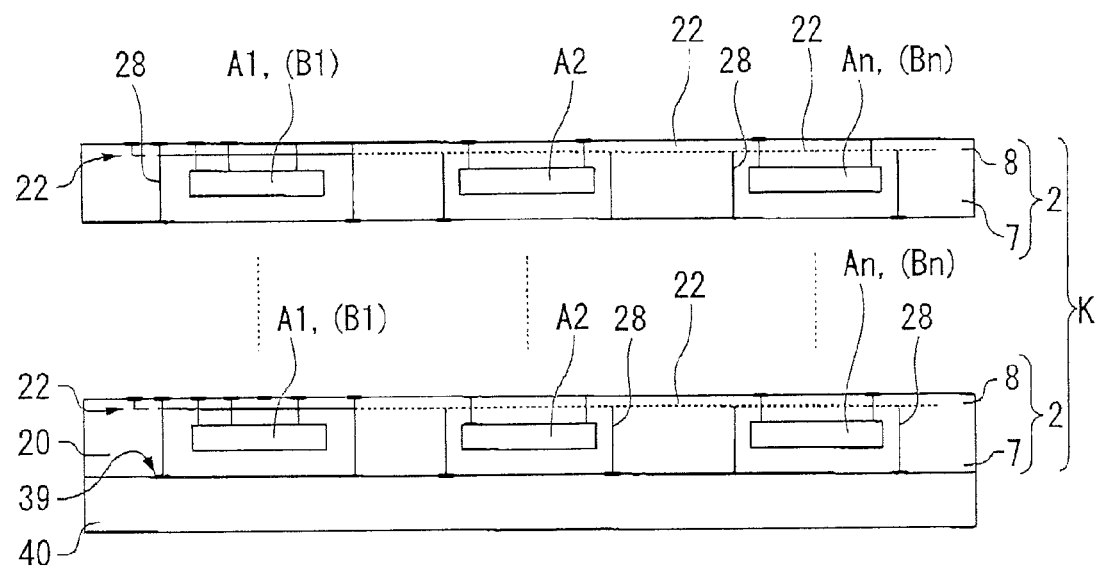
FIG. 25 is a cross-sectional view illustrating mixture of the terminal unit formed area identical type integrated circuit chip components A1 to An, and the terminal unit formed area identical type integrated circuit chip components B1 to Bn on the circuit board.

For example, in FIG. 19B or 25, the terminal unit formation area identical type integrated circuit chip components B may be used in the first layer, while the terminal unit formation area expanded type integrated circuit chip components A may be used in the second layer, or the modules in the required positions may be appropriately replaced either with the terminal unit formation area identical type or the terminal unit formation area expanded type components. Alternatively, the terminal unit formation area expanded type integrated circuit chip components A1 may be used as one component in the first layer, and the terminal unit formation area expanded wiring type integrated circuit chip components A2 may be used as one component in the second layer. In such case, the expanded wiring type and the area identical type integrated circuit chip components are combined in the multi-layer module. The chip multilayer type, for example, can be referred to as Multi Chip Multi layer Module; for example, 1 chip and plural chips combined laminated layers can be referred to as Single and Multi Chip Mixed Multi layer Module.

Figure 21:
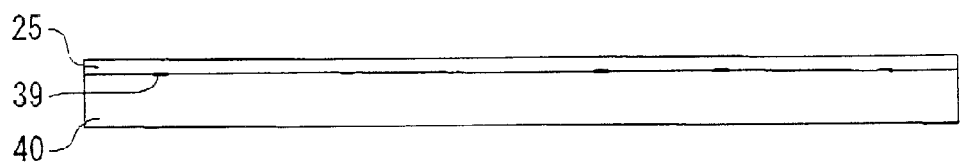
FIG. 21 is a cross-sectional view of the insulating layer formed on the circuit board.
Figure 22:
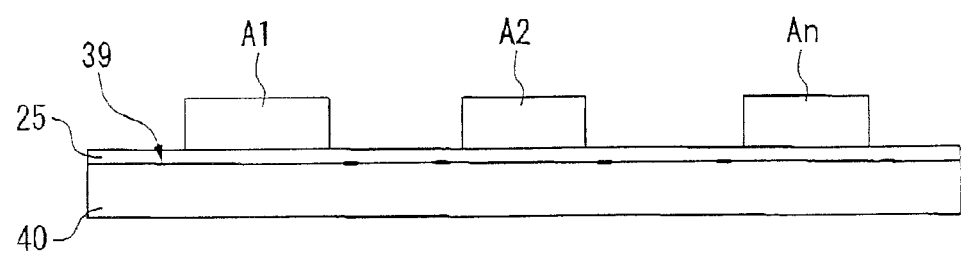
FIG. 22 is a cross-sectional view of the terminal unit formed area expanded type integrated circuit chip components aligned on the insulating layer.
Figure 23:
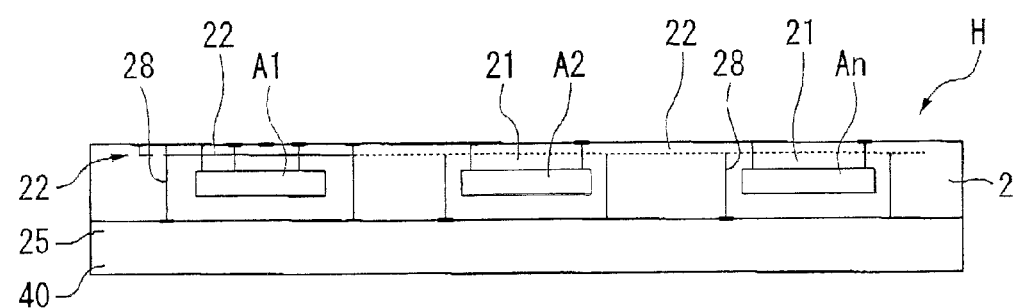
FIG. 23 is a cross-sectional view illustrating one example of the horizontal wiring line formed on the terminal unit formed area expanded type integrated circuit chip components.
Figure 24:
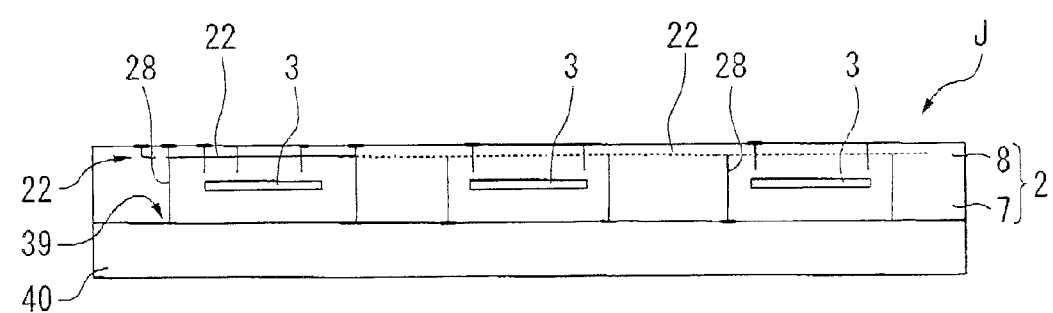
FIG. 24 is a cross-sectional view of the terminal unit formed area expanded type integrated circuit chip illustrated as the one-layer multi-chip module.

FIGS. 21, 22 and 23 illustrate the integrated circuit chip components A formed by replacing the substrate 1 with the printed circuit board 40, it is a multi-chip module in the structure of the integrated circuit chip components A, as described according to FIG. 3 or 7. More specifically, a medium layer 25 is covered or arranged on the printed circuit board, as illustrated in FIG. 21; the medium layer 25 is responsible for adhering and unifying the printed circuit board and the integrated circuit chip components, the integrated circuit chip components A are aligned on the medium layer and covered; they are coated with resins in the same manner as illustrated in FIGS. 14, 15 and 16, then cured and unified for proper wiring arrangement. However, vertical wiring starts from the terminals on the printed circuit board in this case.

Repeating the steps of sequentially mounting the integrated circuit chip components A on the stacked circuit multichip module H, illustrated in FIG. 23 as a base, and forming protective layers can provide multi-layer module K with a stacked structure, as illustrated in FIG. 25. In this embodiment, the terminal unit formation area expanded type integrated circuit chip components A can be appropriately selected and combined with the terminal unit formation area identical type integrated circuit chip components B. Otherwise, it is also possible to structure with only the terminal unit formation area identically type integrated circuit chip components B.

For example, in FIG. 25, the terminal unit formation area identical, type integrated circuit chip components B may be used in the first layer, while the terminal unit formation area expanded type integrated circuit chip components A may be used in the second layer, or the modules in the required positions may be appropriately replaced either with the terminal unit formation area identical type or the terminal unit formation area expanded type components. Alternatively, the terminal, unit formation area expanded type integrated circuit chip components A1 may be used as one component in the first layer, and the terminal unit formation area expanded wiring type integrated circuit chip components A2 may be used as one component in the second layer. In such case, the expanded wiring type and the area identical type integrated circuit chip components are combined in the multi-layer module. The chip multilayer type, for example, can be referred to as Multi Chip Multi layer Module; for example, 1 chip and plural chips combined laminated layers can be referred to as Single and Multi Chip Mixed Multi Layer Module.

Figure 26:
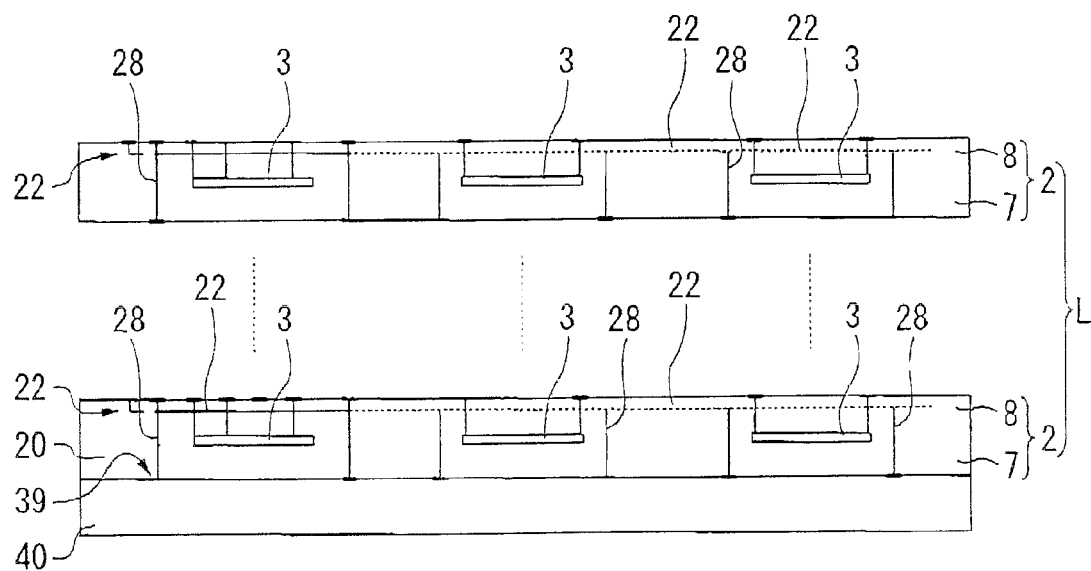
FIG. 26 is a cross-sectional view of the integrated circuit chip illustrated as the multi-layers multi-chip module on the circuit board.

FIG. 26 illustrates that the integration of the integrated circuit chip components is the integration of the integrated circuit chip 3; in other words, it illustrates that the integrated circuit chip components 3 are covered with double insulating material layers and unified and embedded into the exterior insulating materials.

Figure 27:
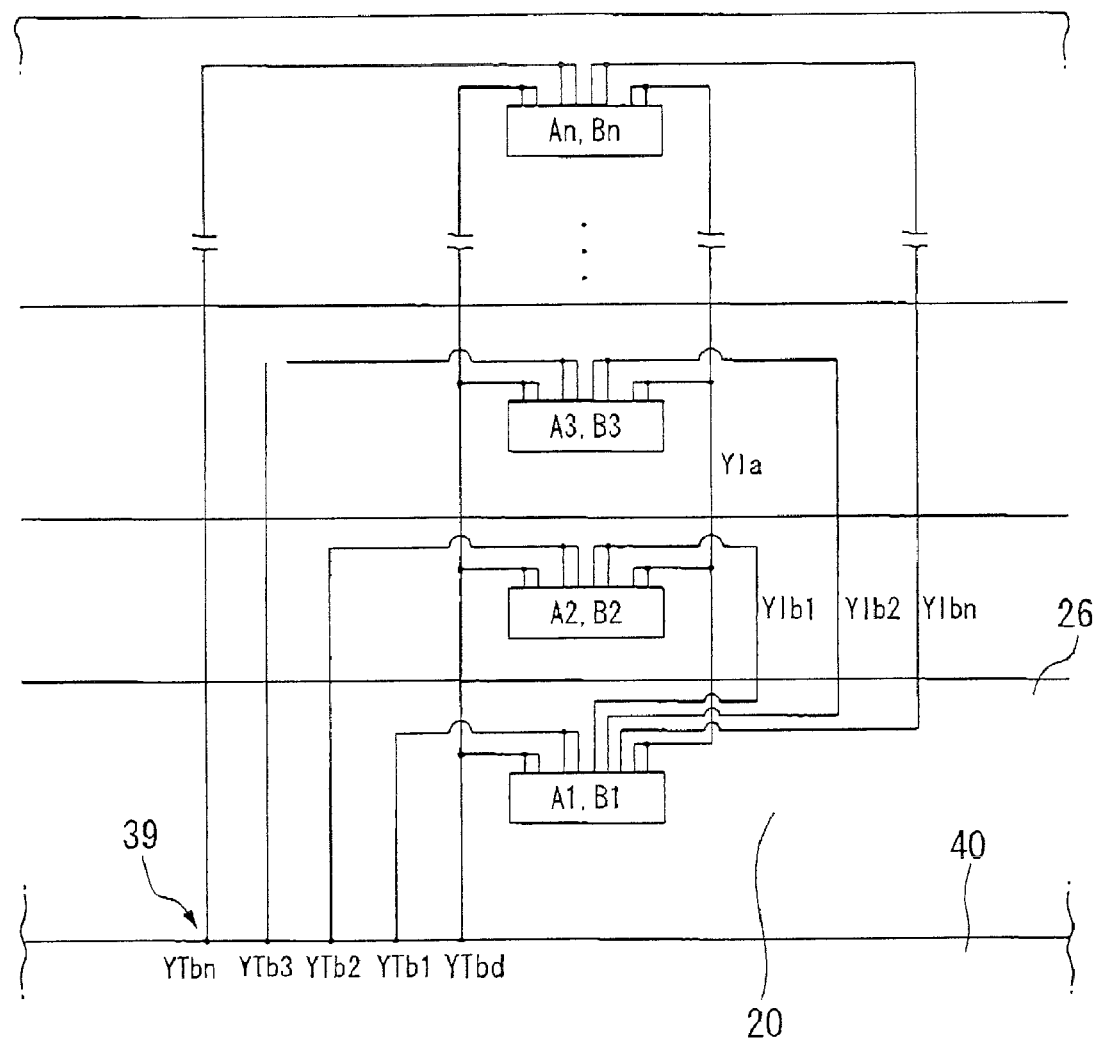
FIG. 27 is a cross-sectional view illustrating the multi-chip module having the wiring unit that selectively connects the integrated circuit chips with upper, lower and multi layers laminated.

FIG. 27 illustrates an example of a structure in which a plurality of the integrated circuit chip components is mounted in a horizontal direction, and a plurality of the expanded wiring type or the area identical, type integrated circuit chip components are arbitrarily stacked in the direction of the thickness on the multi-layer structured multi-chip module, illustrated in FIG. 20 or 26, and also illustrates an example of a circuit wiring in one row in the direction of the lamination layers.

As a wiring pattern that connects the expanded wiring type integrated circuit chip components A1 to An, as described in the above example, or the area identical type integrated circuit chip components B1 to Bn; wiring may be connected with every other or plural units of the integrated circuit chip components aligned above and below. Otherwise, they can be sequentially connected with every layer.

For example, wiring arrangement can be provided in the wiring YIb1 that connects the integrated circuit chip components A1 in the first layer to the integrated circuit chip components A2 in the second layer; the wiring YIb2 that connects the integrated circuit chip components A1 to the integrated circuit chip components A2 integrated circuit chip components A1 in the third layer, and the wiring YIbn that connects the integrated circuit chip components A1 in the first layer to the integrated circuit chip components An in the n-th layer. Furthermore, the exterior connection wiring YIb1 to YIbn can be mounted as the vertical wiring in order to separately arrange exterior wiring to these integrated circuit chip components A1 to An. Separated from these wiring arrangements, wiring YIa, such as a commonly-used address wiring, and common power source wiring to the integrated circuit chip components A1 to An for interconnection.

Figure 28:
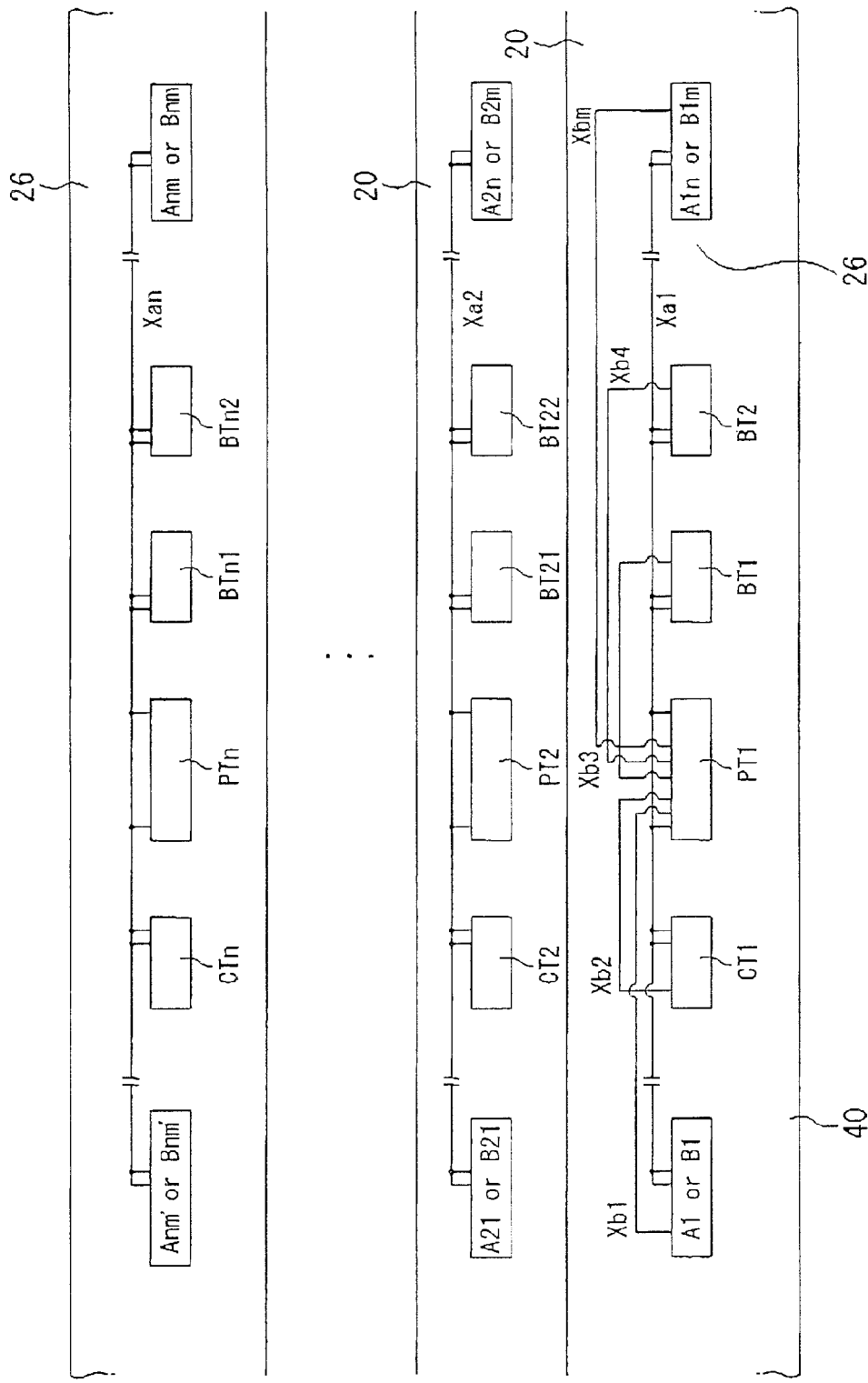
FIG. 28 is a cross-sectional view illustrating the multi-chip module having the wiring unit that selectively connects the integrated circuit chips aligned in the horizontal direction out of those with upper, lower and multi layers laminated.

FIG. 28 illustrates other examples of the horizontally directed wiring structure on the multi-chip module, as illustrated in FIG. 20 or 26.

FIG. 28 illustrates an example of stacking a wiring pattern that connects the integrated circuit chip components A1 to An, or the area identical type integrated circuit chip components B1 to Bn as well as other components; for example, control chips CT1 to CTn, processor tips PT1 to PTn, and buffer tips BT1 to BTn.

On the structure, as illustrated in FIG. 28, wirings Xa1 to Xan, such as address wirings and common power source wirings can be mounted; the address wirings are commonly wired to all of the integrated circuit chip components A1 to An that are aligned in a horizontal direction in every layer; the control tip CT, processor tips PT1 to PTn, and buffer tip BT, and selective wirings Xb1 to Xbn can be further mounted; the selective wirings only and appropriately connect whatever may be needed among the integrated circuit chip components A1 to An, the control tip CT and the buffer tip BT.

As described above, the multi-layer structured multi-chip module according to the present invention can use common wiring, or separate wiring, and further exterior wiring in any of the horizontal or vertical directions, and in arbitral combination, as illustrated in FIGS. 27 and 28.

These various wirings are, of course, not only applied to the stacked structure under this structure, but any of these wrings (wirings Xa1 to Xan, selective wirings Xb1 to Xbn) may be applied to the multi-chip module C, as illustrated in FIG. 11, the multi-chip module D, as illustrated in FIG. 16, the multi-chip module E, as illustrated in FIGS. 17 and 18, and the multi-chip modules F, F2 and G, as illustrated in FIGS. 19A, 19B and 20.

It should be noted that electric signals from semiconductor stacked substrates of this type are power signals, ground signals, clock signals, address signals, chip select signals, various control signals, data signals, and command signals; so that the structure of the present invention can be applied to various substrates including actual memory substrates, video board substrates, mother board substrates by means of selecting, and mounting the necessary numbers of the wrings necessary for transmitting each of these signals.

As described above, according to the present invention, it is possible, for example, to integrate with a multilayer on a 1 mm thick multi module structure 32 or more units of the integrated circuit chips 3 that correspond to the integration of the fifth generation silicon technology without special silicon process, and its fabrication costs are extremely less than those expenses incurred for the development of silicon technology. Furthermore, it is possible, as a feature, to provide 1) multi-layer high integration of memories; the memories are well-performed but their cell structures are difficult to be micronized, and 2) high integration of system devices with lower costs; the system devices have different silicon processes and high integration is difficult on a single wafer. It is also possible to incorporate passive components different from the integrated circuit chips 3 into, the protective layer 2 and 20 of the aforementioned structure, expanding the application.

The integration structure of the present invention includes micro integrated circuit chip components; which are not provided by the conventional technology, three-dimensionally arrayed and aligned. Its technology basically remains unchanged irrespectively with the integration density or the thickness of chips even in the future generation, and its fabrication method basically uses the same process, as well as multilayer plating wiring already used in the silicon process, planarization, and the lithography technology, so that development, fabrication and application for this technology incurs less cost and generates lower risks.

Furthermore, since the integrated circuit chip components A and B, as the basic elements in the structure, are selected by product standard tests, and sealed in comparison with the bare chips, yield as the most problem in the integration can be minimized. More specifically, it is possible to basically and only apply functional and characteristic tests of the wiring (connection states, electric resistance, impedance, inductance, capacitance and noise) as the final electric characteristics assurance test for modules during mass production after evaluation of the system and processes of the multi-chip module; resulting in drastically reducing burdens and directly coupling to lower costs, higher quality and higher reliability. Since the integration step also eliminates stress imbalance to the chip surface and it is sealed and protected, reliability after shipments are improved.

The present invention basically applies plating and lithography for patterns, instead of metal coupling; it is possible to provide extremely micronized wiring with high density, high wiring quality and diversity that are missing in the conventional technology. Arbitral connection is also available between the circuit boards, elements three-dimensionally aligned, and the circuit boards. The wiring radius can be a few μm or less. Since plural sources, ground and signal lines can be arbitrarily aligned, pattern accuracy, signal quality (SI) are also improved, so that different chip integration, such as high frequency chip, digital, analog, logic and memory can be easily provided, resulting in fabricating final products with higher high integration available. Furthermore, it is also possible to manufacture functional components such as antennas, and coils, and provide heat releasing functions with thick plating. In other words, the present invention meets all of the requirements as the high density and high functional chip module.

Considering the above descriptions together, the present invention can provide multilayer module having functions capable of exceeding the conventional technology, and greatly contributing to the industrial world and consumers.

INDUSTRIAL APPLICABILITY

The present invention can be applied to a multilayer wiring in a silicon process technique, a planarization technique, a three-dimensional conversion technique for chips, system in-package (SIP), package on package (POP), or a three-dimensional conversion packaging technique, such as multi-packages.

The invention claimed is:

1. A multi-chip module comprising:
an integrated circuit chip component including an integrated circuit chip equipped with a terminal unit provided on a terminal unit formation surface of the integrated circuit chip, a protective layer made of an insulating material that has an area larger than a terminal unit formation surface of the integrated circuit chip and covering at least the terminal unit formation surface, and an expanded wiring unit which is formed in the protective layer to connect the terminal unit to a realigned terminal unit formed on the protective layer, the expanded wiring unit including an interior vertical conducting unit extended from the terminal unit and formed in a thickness direction of the protective layer, a conducting unit that is extended and formed in the surface direction of the protective layer from the interior vertical conducting unit, and an exterior vertical conducting unit that extends from the conducting unit to the exterior of the protective layer so as to be connected to the realigned terminal unit, the integrated circuit chip component meeting the requirement of electric characteristics tests including 100 MHz or higher frequency test, functionary test, AC test and parametric test, and a burn-in test, or having identical quality and reliability thereof;

a further protective layer in which a plurality of the integrated circuit chip components are three-dimensionally aligned at upper and lower layers, and test terminals for the integrated circuit chip component at the lower layer and test terminals for the integrated circuit chip component at the upper layer are electrically connected by vertical conducting units extending through the further protective layer; and a horizontal wiring and a vertical wiring formed in the further protective layers to connect the plurality of the integrated circuit chip components which are three-dimensionally aligned in the further protective layers.

2. The multi-chip module according to claim 1, wherein the multi-chip module is connected via the horizontal wiring or vertical wiring from the exterior to either of the plurality of the integrated circuit chip components.

3. The multi-chip module according to claim 1, wherein: the multi-chip module is formed on the circuit board, electrode joints of the multi-chip module with the circuit board is implemented with electroplating and, the protective layer of the multi-chip module is firmly adhered to the circuit board, so that the multi-chip module is unified with the circuit board.

4. The multi-chip module according to claim 1, wherein: wirings for connecting each terminal of the integrated circuit chip components are provided in the further protective layer; extended connection of other terminals are aligned on the further protective layer; and the plurality of the integrated circuit chip components are separately aligned in the further protective layer when each of the protective layer is unified.

5. The multi-chip module according to claim 1, wherein the integrated circuit chip component is provided together with an integrated circuit chip or a passive component in the further protective layers, the integrated circuit chip or the passive component being wired to the integrated circuit chip.

6. The multi-chip module according to claim 5, wherein the vertical wiring or horizontal wiring selectively connects the integrated circuit chip components in the further protective layer to of the integrated circuit chip or the passive components, and is provided on an exterior of the further protective layer in which the integrated circuit chip components, and the integrated circuit chip or the passive components are aligned.

7. The multi-chip module according to claim 1, wherein the further protective layer is provided with a chip component other than the integrated circuit chip two-dimensionally or three-dimensionally aligned with the integrated circuit chip components.

8. The multi-chip module according to claim 7, wherein the chip component other than the integrated circuit chip includes one or more of a control chip, a processor chip, and a buffer chip.

* * * * *